US010855295B2

United States Patent
Fackenthal et al.

(10) Patent No.: US 10,855,295 B2
(45) Date of Patent: Dec. 1, 2020

(54) ACCESS SCHEMES FOR SECTION-BASED DATA PROTECTION IN A MEMORY DEVICE

(71) Applicant: Micron Technology, Inc., Boise, ID (US)

(72) Inventors: Richard E. Fackenthal, Carmichael, CA (US); Daniele Vimercati, El Dorado Hills, CA (US); Jahanshir Javanifard, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/859,786

(22) Filed: Apr. 27, 2020

(65) Prior Publication Data

US 2020/0259497 A1 Aug. 13, 2020

Related U.S. Application Data

(63) Continuation of application No. 16/536,078, filed on Aug. 8, 2019, now Pat. No. 10,665,285, which is a
(Continued)

(51) Int. Cl.
*H03L 7/181* (2006.01)
*H03L 7/193* (2006.01)
(Continued)

(52) U.S. Cl.
CPC ............... *H03L 7/193* (2013.01); *H03K 5/13* (2013.01); *H03K 21/10* (2013.01); *H03L 7/0805* (2013.01); *H03L 7/0997* (2013.01)

(58) Field of Classification Search
CPC combination set(s) only.
See application file for complete search history.

(56) References Cited

U.S. PATENT DOCUMENTS

| 4,199,591 A | 4/1980 | Miller et al. |
| 5,528,535 A | 6/1996 | Honjo et al. |

(Continued)

FOREIGN PATENT DOCUMENTS

| JP | 4199591 B2 | 12/2008 |
| KR | 20030002650 A | 1/2003 |
| KR | 20180003713 A | 1/2018 |

OTHER PUBLICATIONS

International Search Report and Written Opinion of the International Searching Authority. PCT/US2019/043510 dated Nov. 12, 2019—12 pgs.

(Continued)

*Primary Examiner* — Adam D Houston
(74) *Attorney, Agent, or Firm* — Holland & Hart LLP

(57) ABSTRACT

Methods, systems, and devices for section-based data protection in a memory device are described. In one example, a memory device may include a set memory sections each having memory cells configured to be selectively coupled with access lines of the respective memory section. A method of operating the memory device may include selecting at least one of the sections for a voltage adjustment operation based on a determined value of a timer, and performing the voltage adjustment operation on the selected section by activating each of a plurality of word lines of the selected section. The voltage adjustment operation may include applying an equal voltage to opposite terminals of the memory cells, which may allow built-up charge, such as leakage charge accumulating from access operations of the selected memory section, to dissipate from the memory cells of the selected section.

20 Claims, 10 Drawing Sheets

Related U.S. Application Data continuation of application No. 16/104,711, filed on Aug. 17, 2018, now Pat. No. 10,431,281.

(51) Int. Cl.
*H03L 7/099* (2006.01)
*H03K 5/13* (2014.01)
*H03L 7/08* (2006.01)
*H03K 21/10* (2006.01)

(56) References Cited

U.S. PATENT DOCUMENTS

| | | | |
|---|---|---|---|
| 5,550,770 A | 8/1996 | Kuroda | |
| 5,751,655 A | 5/1998 | Yamazaki et al. | |
| 7,843,750 B2* | 11/2010 | Park | H01L 27/10876 |
| | | | 365/203 |
| 8,085,101 B2* | 12/2011 | Yamamoto | H03L 7/087 |
| | | | 327/156 |
| 9,564,233 B1 | 2/2017 | Cho et al. | |
| 9,697,913 B1 | 7/2017 | Mariani et al. | |
| 9,715,918 B1* | 7/2017 | Kawamura | G11C 11/221 |
| 9,715,919 B1* | 7/2017 | Ingalls | G11C 11/2273 |
| 9,721,638 B1* | 8/2017 | Kawamura | G11C 11/221 |
| 9,721,639 B1* | 8/2017 | Calderoni | G11C 11/221 |
| 9,786,349 B1* | 10/2017 | Calderoni | G11C 11/2273 |
| 9,990,977 B2* | 6/2018 | Kawamura | G11C 11/2253 |
| 10,074,415 B2* | 9/2018 | Kawamura | G11C 11/2273 |
| 10,083,732 B2* | 9/2018 | Calderoni | G11C 11/2275 |
| 10,110,240 B1* | 10/2018 | Satoh | H03L 7/193 |
| 10,403,389 B2* | 9/2019 | Lovett | G11C 29/70 |
| 10,431,281 B1* | 10/2019 | Fackenthal | G11C 11/2273 |
| 10,446,502 B2* | 10/2019 | Bedeschi | G11C 13/003 |
| 10,510,423 B2* | 12/2019 | Vimercati | G11C 16/0483 |
| 10,534,840 B1* | 1/2020 | Petti | G06N 3/04 |
| 10,566,043 B2* | 2/2020 | Kawamura | G11C 11/221 |
| 10,665,285 B2* | 5/2020 | Fackenthal | G11C 11/2257 |
| 10,685,694 B2* | 6/2020 | Sakurai | G11C 11/2293 |
| 2002/0018358 A1* | 2/2002 | Kato | G11C 11/22 |
| | | | 365/145 |
| 2003/0002650 A1 | 1/2003 | Lee | |
| 2003/0151966 A1* | 8/2003 | Demone | G11C 11/4087 |
| | | | 365/222 |
| 2004/0008063 A1* | 1/2004 | Kim | H03L 7/16 |
| | | | 327/158 |
| 2004/0012423 A1* | 1/2004 | Maeda | H03L 7/23 |
| | | | 327/156 |
| 2004/0151271 A1* | 8/2004 | Krueger | G06F 1/04 |
| | | | 375/376 |
| 2004/0222831 A1* | 11/2004 | Mitsumoto | H03L 7/191 |
| | | | 327/157 |
| 2005/0068809 A1 | 3/2005 | Dan et al. | |
| 2005/0077935 A1* | 4/2005 | Giuroiu | H03L 7/1976 |
| | | | 327/156 |
| 2005/0207201 A1 | 9/2005 | Madan et al. | |
| 2005/0276089 A1 | 12/2005 | Madan et al. | |
| 2007/0146025 A1* | 6/2007 | Huang | H03K 5/1565 |
| | | | 327/156 |
| 2007/0152723 A1* | 7/2007 | Ahn | H03L 7/0814 |
| | | | 327/158 |
| 2009/0273378 A1* | 11/2009 | Mangnall | G06F 9/4401 |
| | | | 327/156 |
| 2010/0123491 A1* | 5/2010 | Palmer | H03L 7/07 |
| | | | 327/156 |
| 2010/0202202 A1 | 8/2010 | Roohparvar | |
| 2010/0264962 A1* | 10/2010 | Kitayama | H03L 1/026 |
| | | | 327/156 |
| 2010/0321074 A1* | 12/2010 | Song | H03L 7/1072 |
| | | | 327/157 |
| 2011/0007550 A1* | 1/2011 | Siegert | G11C 8/08 |
| | | | 365/148 |
| 2011/0009083 A1* | 1/2011 | Namba | H03L 7/1976 |
| | | | 455/318 |
| 2011/0019493 A1 | 1/2011 | Ikeda et al. | |
| 2011/0032013 A1* | 2/2011 | Nelson | H03L 7/23 |
| | | | 327/156 |
| 2011/0122973 A1* | 5/2011 | Tsukio | H03L 7/197 |
| | | | 375/316 |
| 2011/0227618 A1* | 9/2011 | Miyano | G06F 1/04 |
| | | | 327/158 |
| 2011/0234272 A1* | 9/2011 | Yu | H03L 7/089 |
| | | | 327/157 |
| 2011/0248752 A1* | 10/2011 | Willey | H03L 7/0816 |
| | | | 327/117 |
| 2011/0305094 A1 | 12/2011 | Perroni et al. | |
| 2012/0014194 A1* | 1/2012 | Deng | G11C 11/412 |
| | | | 365/189.14 |
| 2012/0163519 A1* | 6/2012 | Choudhury | H04L 7/033 |
| | | | 375/354 |
| 2012/0275216 A1* | 11/2012 | Rountree | G11C 7/08 |
| | | | 365/149 |
| 2013/0147529 A1* | 6/2013 | Ganesan | H03L 7/1803 |
| | | | 327/156 |
| 2013/0286716 A1* | 10/2013 | Rountree | G11C 11/4097 |
| | | | 365/149 |
| 2014/0085995 A1 | 3/2014 | Greenfield et al. | |
| 2014/0266351 A1* | 9/2014 | Na | H03L 7/0812 |
| | | | 327/158 |
| 2015/0162917 A1* | 6/2015 | Tsukuda | H03L 7/197 |
| | | | 327/115 |
| 2015/0222469 A1* | 8/2015 | Onishi | H04L 7/0331 |
| | | | 375/376 |
| 2015/0372683 A1* | 12/2015 | Takahashi | H03L 7/0814 |
| | | | 365/233.1 |
| 2016/0077961 A1 | 3/2016 | Erez et al. | |
| 2016/0079988 A1* | 3/2016 | Shiozaki | H03L 7/087 |
| | | | 327/156 |
| 2016/0142060 A1* | 5/2016 | Im | H03L 7/08 |
| | | | 327/158 |
| 2016/0156342 A1* | 6/2016 | Yun | H03K 7/08 |
| | | | 327/158 |
| 2016/0173109 A1* | 6/2016 | Montoriol | H03L 7/1976 |
| | | | 327/156 |
| 2016/0173111 A1* | 6/2016 | Cali | H03L 7/1976 |
| | | | 327/156 |
| 2016/0380752 A1* | 12/2016 | Ahmad | H03L 7/085 |
| | | | 327/158 |
| 2017/0032830 A1* | 2/2017 | Lee | G11C 11/4074 |
| 2017/0047113 A1* | 2/2017 | Kim | G11C 11/565 |
| 2017/0270991 A1* | 9/2017 | Kawamura | G11C 11/2275 |
| 2017/0300423 A1 | 10/2017 | Kamruzzaman | |
| 2017/0372765 A1* | 12/2017 | Kawamura | G11C 11/2259 |
| 2018/0003713 A1 | 1/2018 | Lee et al. | |
| 2018/0033467 A1* | 2/2018 | Villa | G11C 8/16 |
| 2018/0059958 A1* | 3/2018 | Ryan | G06F 3/0647 |
| 2018/0061468 A1* | 3/2018 | Demer | H01L 27/11514 |
| 2018/0081774 A1* | 3/2018 | Kawamura | G11C 29/04 |
| 2018/0137906 A1 | 5/2018 | Vimercati et al. | |
| 2018/0137908 A1 | 5/2018 | Wang et al. | |
| 2018/0286494 A1* | 10/2018 | Lovett | G11C 29/50 |
| 2019/0214433 A1* | 7/2019 | Karpov | H01L 27/2409 |
| 2019/0244641 A1* | 8/2019 | Jamali | G11C 11/4091 |
| 2019/0325934 A1* | 10/2019 | Matsubara | G11C 11/2295 |
| 2019/0348099 A1* | 11/2019 | El-Mansouri | G11C 7/12 |
| 2020/0058341 A1* | 2/2020 | Villa | G11C 11/221 |
| 2020/0075076 A1* | 3/2020 | Lee | G11C 11/4091 |

OTHER PUBLICATIONS

International Search Report and Written Opinion of the International Searching Authority. PCT/US2019/043511 dated Nov. 8, 2019—10 pgs.

* cited by examiner

ACCESS SCHEMES FOR SECTION-BASED DATA PROTECTION IN A MEMORY DEVICE

CROSS REFERENCES

The present Application for Patent is a continuation of U.S. patent application Ser. No. 16/536,078 by Fackenthal et al., entitled "ACCESS SCHEMES FOR SECTION-BASED DATA PROTECTION IN A MEMORY DEVICE," filed Aug. 8, 2019 which is a continuation of U.S. patent application Ser. No. 16/104,711 by Fackenthal et al., entitled "ACCESS SCHEMES FOR SECTION-BASED DATA PROTECTION IN A MEMORY DEVICE," filed Aug. 17, 2018 which is related to the following co-pending U.S. Patent Application: "ACCESS SCHEMES FOR ACTIVITY-BASED DATA PROTECTION IN A MEMORY DEVICE," by Villa et al., each of which is assigned to the assignee hereof, and each of which is expressly incorporated by reference herein.

BACKGROUND

The following relates generally to memory systems and more specifically to access schemes for section-based data protection in a memory device.

Memory devices are widely used to store information in various electronic devices such as computers, wireless communication devices, cameras, digital displays, and the like. Information is stored by programming different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, access operations on selected memory cells of a section of a memory device may cause charge to accumulate on non-selected memory cells of the section of the memory device, which may contribute to a loss of data stored in the non-selected memory cells.

DETAILED DESCRIPTION

Figure 1:
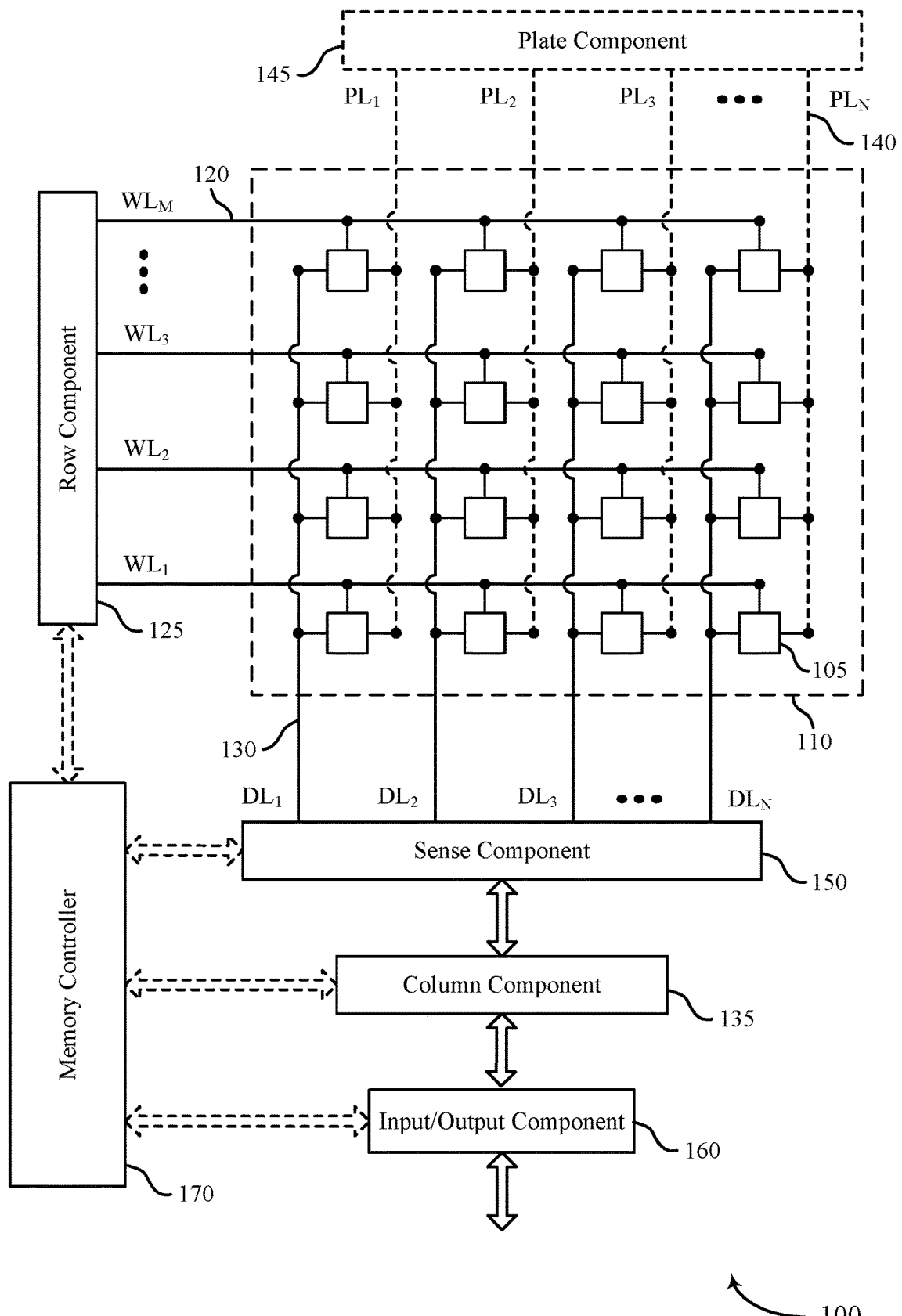
FIG. 1 illustrates an example memory device that supports access schemes for section-based data protection in a memory device in accordance with examples of the present disclosure.

The logic state of memory cells may be maintained by performing access schemes for section-based data protection in a memory device in accordance with aspects of the present disclosure. For example, a memory device may be divided into a number of memory sections. At least some if not each of the memory sections may include a set of memory cells coupled with or between a digit line of the memory section and a plate line, or a common plate, or other common node of the memory section (e.g., node common to all the memory cells of the memory section). Each of the memory cells of a memory section may include or be otherwise associated with a cell selection component configured to selectively couple the memory cell with the associated digit line of the memory section. In some examples, each of the cell selection components may be coupled with (e.g., at a control node, a control terminal, a selection node, or selection terminal of the cell selection component) one of a set of word lines of the memory section, which may be used to activate or deactivate the particular cell selection component.

Access operations (e.g., read operations, write operations, rewrite operations, refresh operations, or combinations thereof) may be performed on selected memory cells (e.g., a memory cell selected or otherwise identified for a respective access operation) of a memory section. In some examples, an access operation may be associated with biasing a plate line or a digit line of an associated memory section. During an access operation, the cell selection component for a selected memory cell may be activated such that the selected memory cell may be selectively coupled with the digit line and the plate line of the associated memory section. Thus, a signal associated with the access operation (e.g., a voltage associated with the access operation, a charge associated with the access operation, a current associated with the access operation) may pass to, from, or through the selected memory cell as a result of the biasing of the digit line or the plate line of the memory section for the access operation.

Although the cell selection components of non-selected memory cells (e.g., cells of a memory section not selected or otherwise identified for the access operation of the memory section) may be deactivated, charge (e.g., leakage charge) may flow through deactivated cell selection components. For example, when a digit line or a plate line of a memory section is biased at a voltage associated with the access operation on a selected memory cell, a difference in voltage between the digit line or the plate line and a non-selected memory cell (e.g., an intermediate node of a non-selected memory cell) may cause charge to flow across the deactivated cell selection component and to or from the non-selected memory cell (e.g., during the access operation on the selected memory cell).

Other mechanisms may also result in a flow of leakage charge, such as a coupling between memory cells that permits leakage charge to flow from a storage element of one memory cell to the storage element of another memory cell (e.g., passing through deactivated cell selection components, passing around deactivated cell selection components, passing from an intermediate node of one memory cell to an intermediate node of another memory cell). In some examples, the leakage charge may cause a bias (e.g., a non-zero bias or voltage) across a memory cell that would otherwise not be present (e.g., a cell that would otherwise have an equalized bias or voltage). Such a leakage charge or zero bias may accumulate on or from non-selected memory cells of a memory section in successive access operations of the memory section, which, in some examples, may cause a loss of data stored in memory cells of the memory section.

In accordance with examples of the present disclosure, operations may be performed on memory sections of a memory device to enable or otherwise support the dissipation of accumulated leakage charge or bias from memory cells of the memory sections. For example, the cell selection components of one or more memory cells (e.g., all of the memory cells) of a selected memory section may be activated (e.g., by activating or "raising" one or more word lines associated with the selected memory section, by activating all word lines associated with the selected memory section).

While the cell selection components of the selected memory section are activated (e.g., "turned on"), the associated digit lines of the selected memory section and plate lines, a common plate, or another common node of the selected memory section may be coupled with voltage sources that support the dissipation of accumulated leakage charge or bias. For example, digit lines and plate lines of a memory section selected for such operations may be coupled with a same voltage source, coupled with different voltage sources having the same voltage, or coupled with voltage sources having voltages that otherwise support the dissipation of leakage charge or bias accumulated at memory cells of the selected memory section. In some examples, the described operations of a memory section associated with such a dissipation of leakage charge or bias may be referred to as a voltage adjustment operation (e.g., a dissipation operation, an equalization operation) for the memory section. The operations may be described as, or be part of a Wordline Only Refresh (WOR) operation.

The selection of a memory section for such operations may be performed according to one or more various intervals. For example, a memory device may include a timer, and a memory section may be selected for a voltage adjustment operation based on a determined value of the timer (e.g., after an initialization of the timer). For example, a determined value of the timer may be representative of a duration since memory device was powered on, or representative of a duration since a prior voltage adjustment operation was performed. In some examples, such a duration may be based on an operating mode of a memory device, where some operating modes may be associated with a different (e.g., shorter or longer) duration between voltage adjustment operations than other operating modes. In some examples, upon a timer reaching a determined value, a memory device may select one of a set of memory sections for a voltage adjustment operation based on an order for adjusting sections of the memory device (e.g., a sequential order), or by selecting a memory section associated with a most-recently performed access operation.

The dissipation of leakage charge or bias accumulated at memory cells of a memory section may prevent or reduce the degradation of a logic state stored by memory cells of the memory section. For example, ferroelectric memory cells of a memory section may operate based on a non-linear polarization behavior (e.g., an ability to store charge in an absence of an applied electrical field). In other words, as one example, a polarized ferroelectric memory storage element may store charge even when no electric field is actively applied across the memory cell (e.g., in an equalized state, in a standby state). Leakage charge or a non-zero bias may cause a degradation or loss of polarization, however, and such a degradation of polarization may be exacerbated by leakage charge or bias accumulating from successive access operations performed at a memory section. By performing the operations described herein (e.g., voltage adjustment operations, dissipation operations, equalization operations), leakage charge or non-zero bias accumulated at ferroelectric memory cells of a memory section, for example, may be dissipated after access operations performed on the memory section, which may mitigate or prevent the accumulation of leakage charge or bias across successive access operations of the memory section, and improve the ability of a memory device to maintain stored data. Further, by selecting a particular memory section for such operations according to a periodic interval, a memory device may operate more efficiently than when such operations are performed after each access operation.

Features of the disclosure introduced above are further described with reference to FIGS. 1 through 3 in the context of memory arrays, memory circuits, and memory cell behaviors that support access schemes for section-based data protection in a memory device. Specific examples are then described with reference to FIGS. 4 and 5, which illustrate a particular circuit and an associated timing diagram that support access schemes for section-based data protection in a memory device. Further examples of methods and circuits that may support the described operations are described with reference to FIGS. 6 and 7. These and other features of the disclosure are further described with respect to FIGS. 8 through 10, which illustrate apparatus and system diagrams that support access schemes for section-based data protection in a memory device.

FIG. 1 illustrates an example memory device 100 that supports access schemes for section-based data protection in a memory device in accordance with various embodiments of the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In some examples, the memory cells 105 may include a capacitive memory element, a ferroelectric memory element, a resistive element, a self-selecting memory element, or a combination thereof.

The set of memory cells 105 may be part of a memory section 110 of the memory device 100 (e.g., including an array of memory cells 105), where in some examples a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common node (e.g., a common plate line, a set of plate lines that are biased to a common voltage). Although only a single memory section 110 of the memory device 100 is shown, various examples of a memory device in accordance with the present disclosure may have a set of memory sections 110. In one illustrative example, a memory device 100 may include 32 "banks" and each bank may include 32 sections. Thus, a memory device 100 according to the illustrative example may include 1,024 memory sections 110.

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged and negatively charged capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating (e.g., non-conductive) layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET" logic state. A more-amorphous state of the material (e.g., an entirely amorphous state, some distribution of relatively small crystal grains that may be substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting memory may enhance differences in a threshold voltage of a memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. In various examples, such arrays may be divided into a set of memory sections 110, where each memory section 110 may be arranged within a deck or level, distributed across multiple decks or levels, or any combination thereof. Such arrangements may increase the number of memory cells 105 that may be placed or created on a single die or substrate as compared with 2D arrays, which in turn may reduce production costs or increase the performance of a memory device 100, or both. The decks or levels may be separated by an electrically insulating material. Each deck or level may be aligned or positioned so that memory cells 105 may be approximately aligned with one another across each deck, forming a stack of memory cells 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a digit line (DL), such as one of $DL_1$ through $DL_N$). In some examples, a row of memory cells 105 of a different memory section 110 (not shown) may be coupled with one of a different plurality of first access lines 120 (e.g., a word line different from $WL_1$ through $WL_M$), and a column of memory cells 105 of the different memory section 110 may be coupled with one of a different plurality of second access lines 130 (e.g., a digit line different from $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines, digit lines, and bit lines, or their analogues, are interchangeable without loss of understanding or operation.

In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive memory element, a ferroelectric memory element, a resistive memory element, other memory element) of a memory cell 105 may be electrically isolated from a second access line 130 by a cell selection component, which, in some examples, may be referred to as a switching component or a selector device. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 of the memory section 110 may also be coupled with one of a plurality of third access lines 140 (e.g., a plate line (PL), such as one of $PL_1$ through $PL_N$). Although illustrated as separate lines, in some examples, the plurality of third access lines 140 may represent or be otherwise functionally equivalent with a common plate line, a common plate, or other common node of the memory section 110 (e.g., a node common to each of the memory cells 105 in the memory section 110), or other common node of the memory device 100. In some examples, the plurality of third access lines 140 may couple memory cells 105 with one or more voltage sources for various sensing and/or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor). In some examples, memory cells 105 of a different memory section 110 (not shown) may be coupled with one of a different plurality of third access lines 140 (e.g., a set of plate lines different from $PL_1$ through $PL_N$, a different common plate line, a different common plate, a different common node).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, and/or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver), or a combination thereof. For example, a row component 125 may receive a row address from the memory controller 170 and activate the appropriate first access line 120 based on the received row address. Similarly, a column component 135 may receive a column address from the memory controller 170 and activate the appropriate second access line 130. Thus, in some examples, a memory cell 105 may be accessed by activating a first access line 120 and a second access line 130. In some examples, such access operations may be accompanied by a plate component 145 biasing one or more of the third access lines 140 (e.g., biasing one of the third access lines 140 of the memory section 110, biasing all of the third access 140 of the memory section, biasing a common plate line of the memory section 110 or the memory device 100, biasing a common node of the memory section 110 or the memory device 100), which may be referred to as "moving the plate" of memory cells 105, the memory section 110, or the memory device 100.

In some examples, the memory controller 170 may control the operation (e.g., read operations, write operations, rewrite operations, refresh operations, discharge operations, voltage adjustment operations, dissipation operations, equalization operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired access line 120 and access line 130. The memory controller 170 may also generate or control various voltages or currents used during the operation of memory device 100. For example, the memory controller 170 may apply a discharge or equalization voltage to one or more of an access line 120, an access line 130, or an access line 140 of a memory section 110 after accessing one or more memory cells 105. Although only a single memory controller 170 is shown, other examples of a memory device 100 may have more than one memory controller 170 (e.g., a memory controller 170 for each of a set of memory sections 110 of a memory device, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions and/or different functions.

Although the memory device 100 is illustrated as including a single row component 125, a single column component 135, and a single plate component 145, other examples of a memory device 100 may include different configurations to accommodate a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110. Additionally, in various memory devices 100, a plate component 145 may be shared among a set of memory sections 110 (e.g., having subcomponents common to all of the set of memory sections 110, having subcomponents dedicated to respective ones of the set of memory sections 110), or a plate component 145 may be dedicated to one memory section 110 of a set of memory sections 110.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of the logic state stored by the memory cell 105 to one or more components (e.g., to the column component 135, the input/output component 160, the memory controller 170). In various memory devices 100, a sense component 150 may be shared among a set of memory sections 110 (e.g., having subcomponents common to all of the set of memory sections 110, having subcomponents dedicated to respective ones of the set of memory sections 110), or a sense component 150 may be dedicated to one memory section 110 of a set of memory sections 110.

In some examples, during or after accessing a memory cell 105, the logic storage portion of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of a row component 125, a column component 135, a plate component 145, a sense component 150, a memory controller 170, or some other component (e.g., a biasing component). In some examples, a discharge of a memory cell 105 may cause a change in the voltage of the access line 130, which the sense component 150 may compare to a reference voltage to determine the stored state of the memory cell 105. In some examples, a voltage may be applied to a memory cell 105 (e.g., using the corresponding access line 120 and access line 130) and the presence of a resulting current may depend on the applied voltage and the resistance state of a memory element of the memory cell 105, which the sense component 150 may use to determine the stored state of the memory cell 105

In some examples, when a read signal (e.g., a read pulse, a read current, a read voltage) is applied across a memory cell 105 with a material memory element storing a first logic state (e.g., a SET state, associated with a more-crystalline atomic configuration), the memory cell 105 conducts current due to the read pulse exceeding a threshold voltage of the memory cell 105. In response or based on this, the sense component 150 may therefore detect a current through the memory cell 105 as part of determining the logic state stored by the memory cell 105. When a read pulse is applied to the memory cell 105 with the memory element storing a second logic state (e.g., a RESET state, associated with a more-amorphous atomic configuration), which may occur before or after the application of a read pulse across a memory cell 105 with a memory element storing a first logic state, the memory cell 105 may not conduct current due to the read pulse not exceeding the threshold voltage of the memory cell 105. The sense component 150 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 120, 130, or 140. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 150). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate sense amplifier, a separate signal development component) for each of a set of access lines 130 coupled with the sense component 150, such that a logic state may be separately detected for a respective memory cell 105 coupled with a respective one of the set of access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

The sense component 150 may be included in a device that includes the memory device 100. For example, the sense component 150 may be included with other read and write circuits, decoding circuits, or register circuits of the memory that may be coupled to the memory device 100. In some examples, the detected logic state of a memory cell 105 may be output through a column component 135 as an output. In some examples, a sense component 150 may be part of a column component 135 or a row component 125. In some examples, a sense component 150 may be connected to or otherwise in electronic communication with a column component 135 or a row component 125.

Although a single sense component 150 is shown, a memory device 100 (e.g., a memory section 110 of a memory device 100) may include more than one sense component 150. For example, a first sense component 150 may be coupled with a first subset of access lines 130 and a second sense component 150 may be coupled with a second subset of access lines 130 (e.g., different from the first subset of access lines 130). In some examples, such a division of sense components 150 may support parallel (e.g., simultaneous) operation of multiple sense components 150. In some examples, such a division of sense components 150 may support matching sense components 150 having different configurations or characteristics to particular subsets of the memory cells 105 of the memory device (e.g., supporting different types of memory cells 105, supporting different characteristics of subsets of memory cells 105, supporting different characteristics of subsets of access lines 130). Additionally or alternatively, two or more sense components 150 may be coupled with a same set of access lines 130 (e.g., for component redundancy). In some examples, such a configuration may support maintaining functionality to overcome a failure or otherwise poor operation of one of the redundant sense components 150. In some examples, such a configuration may support the ability to select one of the redundant sense components 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing the memory cell 105 may degrade or destroy the stored logic state and rewrite or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 120, second access line 130, and/or third access line 140 (e.g., via a memory controller 170). In other words, a logic state may be stored in the memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of PCM, a memory element may be written by applying a current with a profile that causes (e.g., by way of heating and cooling) the memory element to form an atomic configuration associated with a desired logic state.

In some examples in accordance with the present disclosure, the memory device 100 may include a set of memory sections 110. Each of the memory sections 110 may include a set of memory cells 105 coupled with or between one of a set of second access lines 130 and one of a set of third access lines 140 (e.g., of the respective memory section 110). Each of the memory cells 105 may include a cell selection component configured to selectively couple the memory cell 105 with the associated second access line 130 or the associated third access line 140 (e.g., of the respective memory section 110). In some examples, each of the cell selection components may be coupled (e.g., at a control node or a control terminal of the respective cell selection component) with a respective one of the first access lines 120 (e.g., of the memory section 110), which may be used to activate or deactivate the particular cell selection component.

Access operations, which may include read operations, write operations, rewrite operations, refresh operations, or various combinations thereof, may be performed on selected memory cells 105 of a memory section 110. In some examples, access operations may be associated with biasing the second access line 130 or the third access line 140 associated with a selected memory cell 105. During the access operations, cell selection components for the selected memory cell 105 may be activated, such that selected memory cell 105 may be selectively coupled with the second access line 130 or the third access line 140. Thus, signals associated with the access operations (e.g., a voltage associated with an access operation, a charge associated with an access operation, a current associated with an access operation) may pass to, from, or through the selected memory cell 105 as a result of the biasing of the second access line 130 or the third access line 140 for the access operation.

Although the cell selection components of non-selected memory cells 105 of a memory section 110 may be deactivated, leakage charge may flow through deactivated cell selection components of the memory section 110. For example, when the associated second access line 130 or third access line 140 of the memory section 110 is biased at a voltage associated with an access operation on a selected memory cell 105, a difference in voltage between a non-selected memory cell 105 and the second access line 130 or the third access line 140 may cause leakage charge to flow across the deactivated cell selection component to or from the non-selected memory cell 105 (e.g., during the access operation on the selected memory cell). Such a leakage charge may accumulate on non-selected memory cells 105 in successive access operations of a memory section 110, or may cause a non-zero bias or voltage to accumulate at non-selected memory cells of a memory section 110. In some examples, such an accumulation of leakage charge or bias may cause a degradation or loss of data stored in the memory cells 105 of the memory section 110.

In accordance with examples of the present disclosure, operations may be performed on a memory section 110 of a memory device 100 to encourage or otherwise support the dissipation of accumulated leakage charge or bias on memory cells 105 of the memory section 110. For example, at particular intervals (e.g., based on a value of a timer, based on a total number of access operations of the memory device 100), a memory controller 170 may determine to perform operations associated with the dissipation of accumulated leakage charge of bias. Upon determining to perform such operations, the memory controller 170 may select one of a set of memory sections 110 of the memory device 100 upon which to perform the operations.

In some examples, the memory controller 170 may select a memory section 110 based on a determined order for equalizing memory sections 110 (e.g., a sequential order of multiple sections, an order of non-sequential or non-adjacent sections that may be alternating sections or another pattern of sections), which may be referred to as a "round robin" approach. In some examples, the memory controller 170 may select a memory section 110 based on when one or more access operations have been performed. For example, the memory controller 170 may select a memory section 110 associated with a most recently performed access operation (e.g., selecting, for an equalizing operation, a memory section 110 associated with a most recently performed read operation, write operation, rewrite operation, or refresh operation).

The described operations to support the dissipation of accumulated leakage charge or bias may include activating the cell selection components of each of the memory cells 105 of the selected memory section 110 (e.g., by activating each of the first access lines 120 associated with the memory section 110). For example, the operations may include activating each of the first access lines 120 of the selected memory section 110 simultaneously or concurrently, activating a first subset of the first access lines 120 of the selected memory section 110 during a first time period and activating a second subset of the first access lines 120 of the selected memory section 110 during a second time period, or activating each of the first access lines 120 of the selected memory section 110 in a sequential order.

While the cell selection components of the memory cells 105 are activated, the second access lines 130 and the third access lines 140 of the selected memory section 110 may be coupled with voltage sources that support the dissipation of accumulated leakage charge or voltage bias. For example, the second access lines 130 and the third access lines 140 may be coupled with a same voltage source, or coupled with voltage sources having the same voltage, or coupled with voltage sources having voltages that otherwise support the dissipation of leakage charge or bias accumulated at memory cells 105 of the memory section 110.

In various examples, the described operations associated with such a dissipation of leakage charge or bias may be referred to as a voltage adjustment operation. By performing the voltage adjustment operations described herein, leakage charge or voltage bias accumulated at memory cells 105 of a memory section 110 may be dissipated, which may mitigate or prevent the accumulation of leakage charge across successive access operations of a memory section and improve the ability of the memory device 100 to maintain stored data. Further, by selecting a particular memory section 110 for such operations according to a periodic interval, a memory device may operate more efficiently than when such operations are performed, for example, after each access operation.

Figure 2:
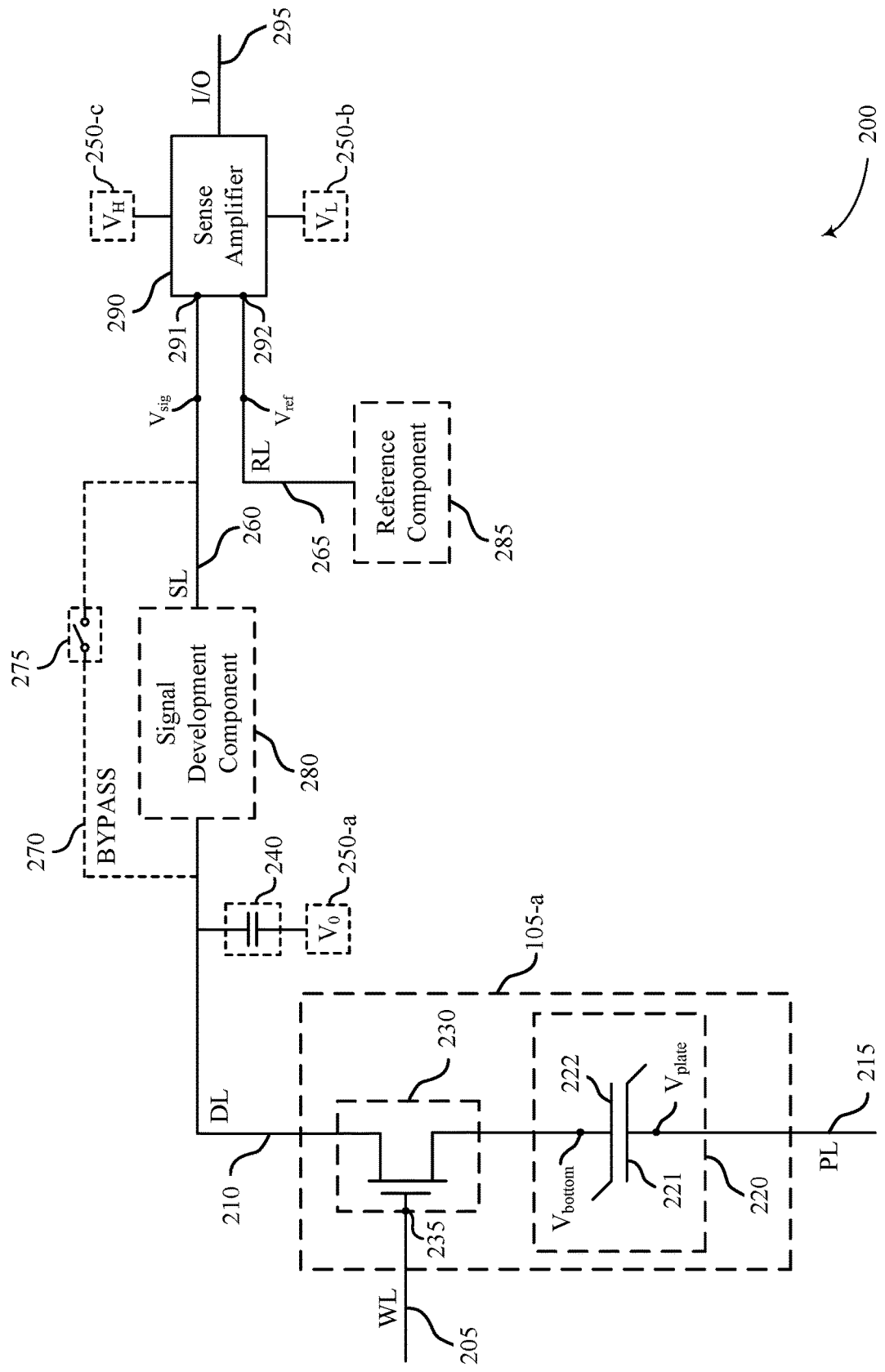
FIG. 2 illustrates an example circuit that supports access schemes for section-based data protection in a memory device in accordance with examples of the present disclosure.

FIG. 2 illustrates an example circuit 200 that supports access schemes for section-based data protection in a memory device in accordance with various embodiments of the present disclosure. Circuit 200 may include a memory cell 105-a, which may be an example of a memory cell 105 described with reference to FIG. 1. Circuit 200 may also include a sense amplifier 290, which may be a portion of a sense component 150 described with reference to FIG. 1. Circuit 200 may also include a word line 205, a digit line 210, and a plate line 215, which, in some examples, may correspond to a first access line 120, a second access line 130, and a third access line 140, respectively (e.g., of a memory section 110), as described with reference to FIG. 1. In some examples, the plate line 215 may be illustrative of a common plate line, a common plate, or another common node for the memory cell 105-a and another memory cell 105 (not shown) of a same memory section 110. The circuit 200 may also include a reference line 265 used by the sense amplifier 290 to determine a stored logic state of the memory cell 105-a.

As illustrated in FIG. 2, the sense amplifier 290 may include a first node 291 and a second node 292 which, in some examples, may be coupled with different access lines of a circuit (e.g., a signal line 260 and a reference line 265 of the circuit 200, respectively) or a common access line of a different circuit (not shown). In some examples, the first node 291 may be referred to as a signal node, and the second node 292 may be referred to as a reference node. However, other configurations of access lines and/or reference lines are possible in accordance with various embodiments of the present disclosure.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, or polarizing the capacitor 220.

The capacitor 220 may be in electronic communication with the digit line 210, and the stored logic state of the capacitor 220 may be read or sensed by operating various elements represented in circuit 200. For example, the memory cell 105-a may also include a cell selection component 230 which, in some examples, may be referred to as a switching component or a selector device coupled with an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a.

The capacitor 220 may be selectively coupled with the digit line 210 when the cell selection component 230 is activated (e.g., by way of an activating logical signal), and the capacitor 220 can be selectively isolated from the digit line 210 when the cell selection component 230 is deactivated (e.g., by way of a deactivating logical signal). A logical signal or other selection signal or voltage may be applied to a control node 235 (e.g., a control node, a control terminal, a selection node, a selection terminal) of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. The word line 205 may be used to activate the cell selection component 230. For example, a selection voltage applied to the word line 205 (e.g., a word line logical signal or a word line voltage) may be applied to the gate of a transistor of cell selection component 230, which may selectively connect the capacitor 220 with the digit line 210 (e.g., providing a conductive path between the capacitor 220 and the digit line 210). In some examples, activating the cell selection component 230 may be referred to as selectively coupling the memory cell 105-*a* with the digit line 210.

In other examples, the positions of the cell selection component 230 and the capacitor 220 in the memory cell 105-*a* may be switched, such that cell selection component 230 may be coupled with or between the plate line 215 and the cell plate 221, and the capacitor 220 may be coupled with or between the digit line 210 and the other terminal of the cell selection component 230. In such an embodiment, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to the digit line 210. In various schemes, to sense the logic state stored by a ferroelectric capacitor 220, a voltage may be applied to the plate line 215 and/or the digit line 210, and the word line 205 may be biased (e.g., by activating the word line 205) to select the memory cell 105-*a*. In some cases, the plate line 215 and/or the digit line 210 may be virtually grounded and then isolated from the virtual ground, which may be referred to as a floating condition, an idle condition, or a standby condition, prior activating the word line 205.

Operation of the memory cell 105-*a* by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by the sense component 150-*a* to determine the stored logic state of the memory cell 105-*a*.

The digit line 210 may be coupled with additional memory cells 105 (not shown), and the digit line 210 may have properties that result in a non-negligible intrinsic capacitance 240 (e.g., on the order of picofarads (pF)), which may couple the digit line 210 with a voltage source 250-*a*. The voltage source 250-*a* may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

In some examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-*a* may depend on the net capacitance of (e.g., associated with) the digit line 210. In other words, as charge flows along the digit line 210 (e.g., to the digit line 210, from the digit line 210), some finite charge may be stored along the digit line 210 (e.g., in the intrinsic capacitance 240, other capacitance coupled with the digit line 210), and the resulting voltage of the digit line 210 may depend on the net capacitance of the digit line 210.

The resulting voltage of the digit line 210 after selecting the memory cell 105-*a* may be compared to a reference (e.g., a voltage of the reference line 265) by the sense component 150-*a* to determine the logic state that was stored in the memory cell 105-*a*. In some examples, a voltage of the reference line 265 may be provided by a reference component 285. In other examples, the reference component 285 may be omitted and a reference voltage may be provided, for example, by accessing the memory cell 105-*a* to generate the reference voltage (e.g., in a self-referencing access operation). Other operations may be used to support selecting and/or sensing the memory cell 105-*a*, including operations for supporting access schemes for section-based data protection as described herein.

In some examples, the circuit 200 may include a signal development component 280, which may be an example of a signal development circuit coupled with or between the memory cell 105-*a* and the sense amplifier 290. The signal development component 280 may amplify or otherwise convert signals of the digit line 210 prior to a sensing operation. The signal development component 280 may include, for example, a transistor, an amplifier, a cascode, or any other charge or voltage converter or amplifier component. In some examples, the signal development component 280 may include a charge transfer sensing amplifier (CTSA). In some examples with a signal development component 280, a line between the sense amplifier 290 and the signal development component 280 may be referred to as a signal line (e.g., signal line 260). In some examples (e.g., examples with or without a signal development component 280), the digit line 210 may connect directly with the sense amplifier 290.

In some examples, the circuit 200 may include a bypass line 270 that may permit selectively bypassing the signal development component 280 or some other signal generation circuit between the memory cell 105-*a* and the sense amplifier 290. In some examples, the bypass line 270 may be selectively enabled by way of a switching component 275. In other words, when the switching component 275 is activated, the digit line 210 may be coupled with the signal line 260 via the bypass line 270 (e.g., coupling the memory cell 105-*a* with the sense component 150-*a*).

In some examples, when the switching component 275 is activated, the signal development component 280 may be selectively isolated from one or both of the digit line 210 or the signal line 260 (e.g., by another switching component or selection component, not shown). When the switching component 275 is deactivated, the digit line 210 may be selectively coupled with the signal line 260 via the signal development component 280. In other examples, a selection component may be used to selectively couple the memory cell 105-*a* (e.g., the digit line 210) with one of the signal development component 280 or the bypass line 270. Additionally or alternatively, in some examples, a selection component may be used to selectively couple the sense amplifier 290 with one of the signal development component 280 or the bypass line 270. In some examples, a selectable bypass line 270 may support generating a sense signal for detecting a logic state of the memory cell 105-*a* by using the signal development component 280, and generating a write signal to write a logic state to the memory cell 105-*a* that bypasses the signal development component 280.

Some examples of a memory device that supports the described access schemes for section-based data protection may share a common access line (not shown) between a memory cell 105 and a sense amplifier 290 to support generating a sense signal and a reference signal from the same memory cell 105. In one example, a common access line between a signal development component 280 and a sense amplifier 290 may be referred to as a "common line," an "AMPCAP line," or an "AMPCAP node," and the common access line may take the place of the signal line 260 and the reference line 265 illustrated in circuit 200. In such examples the common access line may be connected to the sense amplifier 290 at two different nodes (e.g., a first node 291 and a second node 292, as described herein). In some examples, a common access line may permit a self-referencing read operation to share, in both a signal generating operation and a reference generating operation, components that may exist between the sense amplifier 290 and a memory cell 105 being accessed. Such a configuration may reduce the sensitivity of the sense amplifier 290 to operational variations of various components in a memory device, such as memory cells 105, access lines (e.g., a word line 205, a digit line 210, a plate line 215), signal development circuits (e.g., signal development component 280), transistors, voltage sources 250, and others.

Although the digit line 210 and the signal line 260 are identified as separate lines, the digit line 210, the signal line 260, and any other lines connecting a memory cell 105 with a sense component 150 may be referred to as a single access line in accordance with the present disclosure. Constituent portions of such an access line may be identified separately for the purposes of illustrating intervening components and intervening signals in various example configurations.

The sense amplifier 290 may include various transistors or amplifiers to detect, convert, or amplify a difference in signals, which may be referred to as latching. For example, the sense amplifier 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher (e.g., a positive) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a first sense amplifier voltage source 250-b (e.g., a voltage of $V_L$, which may be a ground voltage substantially equal to $V_0$ or a negative voltage). A sense component 150 that includes the sense amplifier 290 may latch the output of the sense amplifier 290 to determine the logic state stored in the memory cell 105-a (e.g., detecting a logic 0 when the first node 291 has a lower voltage than the second node 292).

If the first node 291 has a higher voltage than the second node 292, the output of the sense amplifier 290 may be driven to the voltage of a second sense amplifier voltage source 250-c (e.g., a voltage of $V_H$). A sense component 150 that includes the sense amplifier 290 may latch the output of the sense amplifier 290 to determine the logic state stored in the memory cell 105-a (e.g., detecting a logic 1 when the first node 291 has a higher voltage than the second node 292). The latched output of the sense amplifier 290, corresponding to the detected logic state of memory cell 105-a, may then be output via one or more input/output (I/O) lines (e.g., I/O line 295), which may include an output through a column component 135 via input/output component 160 described with reference to FIG. 1.

To perform a write operation on the memory cell 105-a, a voltage may be applied across the capacitor 220. Various methods may be used. In one example, the cell selection component 230 may be activated through the word line 205 (e.g., by activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense amplifier 290 may be used to perform the write operations, which may include coupling the first sense amplifier voltage source 250-b or the second sense component voltage source 250-c with the digit line. When the sense amplifier 290 is used to perform the write operations, the signal development component 280 may or may not be bypassed (e.g., by applying a write signal via the bypass line 270).

The circuit 200, including the sense amplifier 290, the cell selection component 230, the signal development component 280, or the reference component 285, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 290, a substrate for the signal development component 280, a substrate for the memory cell 105-a), or the transistor(s) may be formed on a substrate that is common for particular components of the circuit 200 (e.g., a substrate that is common for the sense amplifier 290, the signal development component 280, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In some examples in accordance with the present disclosure, an access operation may be performed on a selected memory cell 105 other than the memory cell 105-a that is coupled with the digit line 210. In such an example, the memory cell 105-a may be referred to as a non-selected memory cell. The access operation may be associated with biasing the digit line 210 and the plate line 215. Although the cell selection component 230 of the non-selected memory cell 105-a may be deactivated, leakage charge may flow through the cell selection component 230 (e.g., via the digit line 210). Such a leakage charge may accumulate on the non-selected memory cell 105-a (e.g., at an intermediate node of the memory cell 105-a, at the cell bottom 222 of the capacitor 220), or flow from the non-selected memory cell 105-a, or may cause a bias (e.g., a non-zero voltage) to accumulate across at least some of the non-selected memory cell 105-a which, in some examples, may cause a loss of data stored in at least some of the non-selected memory cells 105.

In accordance with examples of the present disclosure, operations may be performed on a memory section 110 that includes the memory cell 105-a to encourage or otherwise support the dissipation of accumulated leakage charge or bias from the non-selected memory cell 105-a, and other memory cells 105 of the memory section 110 that may have accumulated leakage charge or bias. For example, according to a periodic interval (e.g., a periodic section selection interval, a periodic dissipation interval, a periodic equalization interval, a periodic voltage adjustment interval), a memory controller 170 may select the memory section 110 that includes the memory cell 105-a for a voltage adjustment operation, and as part of the voltage adjustment operation the cell selection component 230 may be activated (e.g., by activating the word line 205). While the cell selection component 230 is activated, the digit line 210 and the plate line 215 may be coupled with voltage sources that support the dissipation of accumulated leakage charge or bias. For example, the digit line 210 and the plate line 215 may be coupled with a same voltage source, or coupled with voltage sources having the same voltage, or coupled with voltage sources having voltages that otherwise support the dissipation of leakage charge or bias accumulated at non-selected memory cell 105-a.

In some examples, the described operations associated with such a dissipation of leakage charge or bias may be referred to as a voltage adjustment operation. By performing the operations described herein, leakage charge or bias accumulated at memory cells 105 of a memory section 110 may be dissipated, which may mitigate or prevent the accumulation of leakage charge or bias across successive access operations of the memory section 110 and improve the ability of the memory device 100 to maintain stored data. Further, by selecting a particular memory section 110 for such operations according to a periodic interval, a memory device may operate more efficiently than when such operations are performed, for example, after each access operation.

Figure 3:
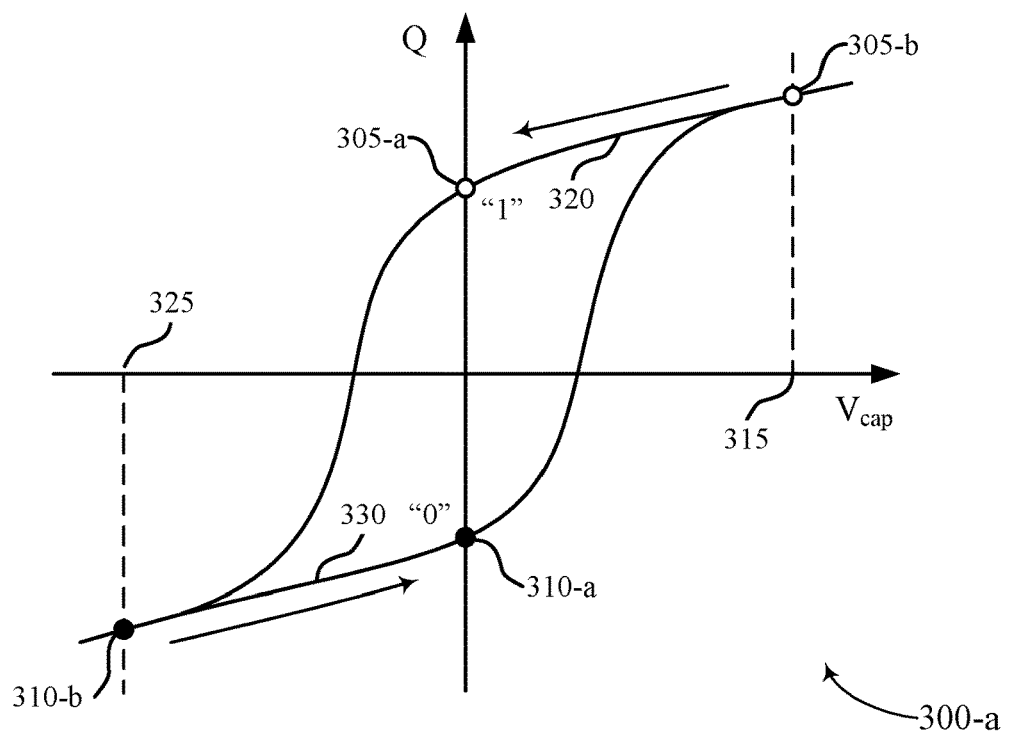
FIG. 3 illustrates an example of non-linear electrical properties with hysteresis plots for a memory cell that supports access schemes for section-based data protection in a memory device in accordance with examples of the present disclosure.
Figure 3:
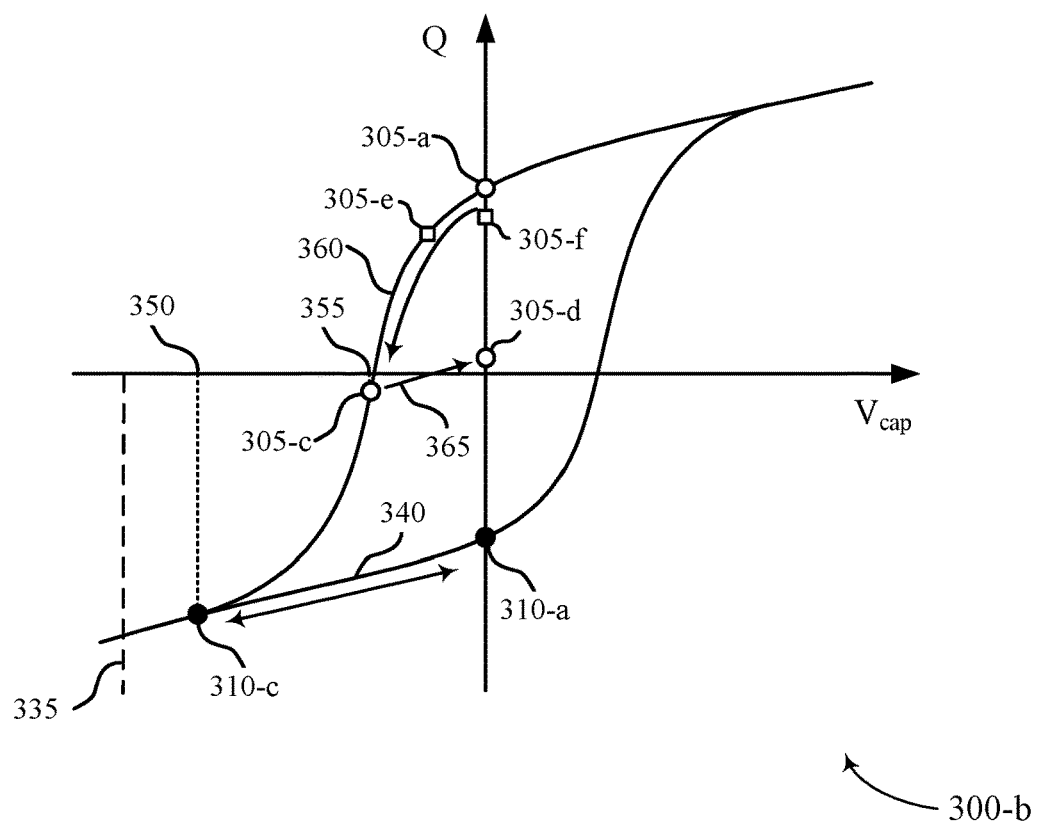

FIG. 3 illustrates an example of non-linear electrical properties with hysteresis plots 300-a and 300-b for a memory cell 105 that supports access schemes for section-based data protection in a memory device in accordance with various embodiments of the present disclosure. The hysteresis plots 300-a and 300-b may illustrate an example writing process and reading process, respectively, for a memory cell 105 employing a ferroelectric capacitor 220 as described with reference to FIG. 2. The hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by a spontaneous electric polarization, where the material may maintain a non-zero electric charge in the absence of an electric field. Examples of ferroelectric materials include barium titanate (BaTiO3), lead titanate (PbTiO3), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220.

Additionally, it should be understood that the voltages in the hysteresis plots 300-a and 300-b represent a voltage difference across the capacitor (e.g., an electric potential between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-b, which may represent a positively saturated polarization state and a negatively saturated polarization state, respectively. The charge states 305-a and 310-a may be at a physical condition illustrating remnant polarization (Pr) values, which may refer to the polarization (or charge) that remains upon removing the external bias (e.g., voltage). The coercive voltage is the voltage at which the charge or polarization is zero. According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. In other words, charge state 305-a may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In other words, charge state 310-a may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state resulting from a read operation may depend on whether the charge state 305-a, or the charge state 310-a, or some other charge state was initially stored, among other factors.

The hysteresis plot 300-b illustrates an example of access operations for reading stored charge states 305-a and 310-a. A read voltage 335 may be applied, for example, as a voltage difference via a digit line 210 and a plate line 215 as described with reference to FIG. 2. The hysteresis plot 300-b may illustrate read operations where the read voltage 335 is negative voltage difference $V_{cap}$ (e.g., where $V_{bottom} - V_{plate}$ is negative). A negative read voltage across the ferroelectric capacitor 220 may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative access operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a cell selection component 230 via a word line 205 as described with reference to FIG. 2). Upon applying the read voltage 335 to the ferroelectric capacitor 220, charge may flow into or out of the ferroelectric capacitor 220 via the associated digit line 210 and plate line 215, and different charge states may result depending on whether the ferroelectric capacitor 220 was at the charge state 305-a (e.g., a logic 1) or at the charge state 310-a (e.g., a logic 0), or some other charge state.

When performing a read operation on a ferroelectric capacitor 220 at the charge state 310-a (e.g., a logic 0), additional negative charge may accumulate across the ferroelectric capacitor 220, and the charge state may follow path 340 until reaching the charge and voltage of the charge state 310-c. The amount of charge flowing through the capacitor 220 may be related to the intrinsic or other capacitance of the digit line 210 (e.g., intrinsic capacitance 240 described with reference to FIG. 2).

Accordingly, as shown by the transition between the charge state 310-a and the charge state 310-c, the resulting voltage 350 across the ferroelectric capacitor 220 may be a relatively large negative value due to the relatively large change in voltage for the given change in charge. Thus, upon reading a logic 0 in a "plate high" read operation, the digit line voltage, equal to the sum of $V_{PL}$ and the value of ($V_{bottom}-V_{plate}$) at the charge state 310-c, may be a relatively low voltage. Such a read operation may not change the remnant polarization of the ferroelectric capacitor 220 that stored the charge state 310-a, and thus after performing the read operation the ferroelectric capacitor 220 may return to the charge state 310-a via path 340 when the read voltage 335 is removed (e.g., by applying a zero net voltage across the ferroelectric capacitor 220, by equalizing the voltage across the ferroelectric capacitor 220). Thus, performing a read operation with a negative read voltage on a ferroelectric capacitor 220 with a charge state 310-a may be considered a non-destructive read process.

When performing the read operation on the ferroelectric capacitor 220 at the charge state 305-a (e.g., a logic 1), the stored charge may reverse polarity as a net negative charge accumulates across the ferroelectric capacitor 220, and the charge state may follow the path 360 until reaching the charge and voltage of the charge state 305-c. The amount of charge flowing through the ferroelectric capacitor 220 may again be related to the intrinsic or other capacitance of the digit line 210 (e.g., intrinsic capacitance 240 described with reference to FIG. 2). Accordingly, as shown by the transition between the charge state 305-a and the charge state 305-c, the resulting voltage 355 may, in some cases, be a relatively small negative value due to the relatively small change in voltage for the given change in charge. Thus, upon reading a logic 1 in a "plate high" read operation, the digit line voltage, equal to the sum of $V_{PL}$ and the value of ($V_{bottom}-V_{plate}$) at the charge state 305-c, may be a relatively plate, high voltage.

In some examples, a read operation with a negative read voltage (e.g., read voltage 335) may result in a reduction or a reversal of remnant polarization of the capacitor 220 that stored the charge state 305-a. In other words, according to the properties of the ferroelectric material, after performing the read operation the ferroelectric capacitor 220 may not return to the charge state 305-a when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation with read voltage 335, the charge state may follow path 365 from the charge state 305-c to the charge state 305-d, illustrating a net reduction in polarization magnitude (e.g., a less positively polarized charge state than initial charge state 305-a, illustrated by the difference in charge between the charge state 305-a and the charge state 305-d). Thus, performing a read operation with a negative read voltage on a ferroelectric capacitor 220 with a charge state 305-a may be described as a destructive read process. However, in some sensing schemes, a reduced remnant polarization may still be read as the same stored logic state as a saturated remnant polarization state (e.g., supporting detection of a logic 1 from both the charge state 305-a and the charge state 305-d), thereby providing a degree of non-volatility for a memory cell 105 with respect to read operations.

The transition from the charge state 305-a to the charge state 305-d may be illustrative of a sensing operation that is associated with a partial reduction and/or partial reversal in polarization of a ferroelectric capacitor 220 of a memory cell 105 (e.g., a reduction in the magnitude of charge Q from the charge state 305-a to the charge state 305-d). In some examples, the amount of change in polarization of a ferroelectric capacitor 220 of a memory cell 105 as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at the charge state 305-a may result in a full reversal of polarization, with the ferroelectric capacitor 220 transitioning from the charge state 305-a to the charge state 310-a after the sensing operation.

The position of the charge state 305-c and the charge state 310-c after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 150 may not be equal to the read voltage 335, or the resulting voltages 350 or 355, and instead may depend on the voltage of the digit line 210 following a period of charge sharing.

The position of the charge state 305-c and the charge state 310-c on hysteresis plot 300-b upon initiating a read operation may depend on the net capacitance of the digit line 210 and may be determined through a load-line analysis. In other words, the charge states 305-c and 310-c may be defined with respect to the net capacitance of the digit line 210. As a result, the voltage of the ferroelectric capacitor 220 after initiating a read operation (e.g., voltage 350 when reading the ferroelectric capacitor 220 that stored the charge state 310-a, voltage 355 when reading the ferroelectric capacitor 220 that stored the charge state 305-a), may be different and may depend on the initial state of the ferroelectric capacitor 220.

The initial state (e.g., charge state, logic state) of the ferroelectric capacitor 220 may be determined by comparing the voltage of a digit line 210 (or signal line 260, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-a, or voltage 355 when reading the ferroelectric capacitor 220 having a stored the charge state 305-a). In some examples, the digit line voltage may be the difference between the read voltage 335 and the final voltage across the capacitor 220 (e.g., (read voltage 335-voltage 350) when reading the ferroelectric capacitor 220 having a stored the charge state 310-a, (read voltage 335-voltage 355) when reading the ferroelectric capacitor 220 having a stored the charge state 305-a).

In some sensing schemes, a reference voltage may be generated such that the reference voltage is between the possible voltages that may result from reading different logic states. For example, a reference voltage may be selected to be lower than the resulting digit line voltage when reading a logic 1, and higher than the resulting digit line voltage when reading a logic 0. In other examples, a comparison may be made at a portion of a sense component 150 that is different from a portion where a digit line is coupled, and therefore a reference voltage may be selected to be lower than the resulting voltage at the comparison portion of the sense component 150 when reading a logic 1, and higher than the resulting voltage at the comparison portion of the sense component 150 when reading a logic 0. During comparison by the sense component 150, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors 220 of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic or other capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of digit line voltage from one memory cell to the next (e.g., resulting voltage 350 may vary from reading one memory cell 105 to the next), and reading a logic 0 may be associated with different levels of digit line voltage from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference," and having a low minimum read voltage difference may be associated with difficulties in reliably sensing the logic states of memory cells in a given memory device.

In some examples, a sense component 150 may be designed to employ self-referencing techniques, where a memory cell 105 itself is involved in providing a reference signal when reading the memory cell 105. However, when using the same memory cell 105 for providing both a sense signal and a reference signal, the sense signal and the reference signal may be substantially identical when performing access operations that do not change a state stored by the memory cell 105. For example, when performing a self-referencing read operation on a memory cell 105 storing a logic 1 (e.g., storing a charge state 310-a), a first access operation that may include applying the read voltage 335 may follow path 340, and a second operation that may also include applying the read voltage 335 may also follow path 340, and the first and second access operations may result in substantially the same access signals (e.g., from the perspective of the memory cell 105). In such cases, when employing a sense component 150 that relies on a difference between a sense signal and a reference signal to detect a logic state stored by the memory cell 105, some other portion of a memory device may provide such a difference in the event that access operations might provide substantially equal sense and reference signals.

In some examples in accordance with the present disclosure, cell selection components 230 of non-selected memory cells 105 of a memory section 110 may be deactivated, but leakage charge may nonetheless flow through the deactivated cell selection components 230 of the memory section 110 during an access operation associated with a different, selected memory cell 105 of the memory section 110. In an example of a ferroelectric memory cell 105, the leakage charge or bias may accumulate at a ferroelectric capacitor 220 (e.g., a cell bottom 222) of non-selected memory cells 105 of the memory section 110, which may alter the polarization of the ferroelectric capacitor 220.

For example, when the ferroelectric capacitor 220 of a non-selected memory cell 105 of a memory section 110 is at a charge state 305-a (e.g., storing a logic 1), leakage charge associated with an access operation on a selected memory cell 105 (e.g., a plate high read operation for a selected memory cell 105, a write operation associated with writing a logic 0 on a selected memory cell 105) of the memory section may cause the charge state of the non-selected memory cell 105 to follow at least a portion of the path 360. In some examples, a first access operation on a selected memory cell 105 may cause the ferroelectric capacitor 220 of a non-selected memory cell to reach the charge state 305-e (e.g., accumulating leakage charge illustrated by the change in charge Q from charge state 305-a to charge state 305-e, accumulating a bias illustrated by the change in voltage $V_{cap}$ from charge state 305-a to charge state 305-e). However, in the event that the non-selected memory cell 105 remains as non-selected for subsequent access operations for selected memory cells 105 (e.g., a same selected memory cell 105, one or more different selected memory cells 105) of the same memory section 110, the non-selected memory cell 105 may continue along the path 360 as leakage charge or bias continues to accumulate, until reaching charge state 305-c, for example.

The charge state 305-c may represent a substantial loss of polarization, which may be represented by the difference in stored charge between the charge state 305-a and the charge state 305-d. In other words, if the voltage across the non-selected memory cell 105 is equalized after a set of access operations for selected memory cells other than the non-selected memory cell 105, the non-selected memory cell 105 may follow the path 365 from the charge state 305-c to the charge state 305-d, illustrating a substantially lower polarization or charge than the charge state 305-a. In some examples, this loss of charge or polarization may be associated with a charge state that is indeterminate regarding one logic state or another. In some examples, a charge state may become indeterminate if a polarization has decreased more than 30% from a saturated polarization state (e.g., less than 70% of the charge Q associated with the charge state 305-a). Thus, in some examples, the transition between charge state 305-a and charge state 305-d (e.g., via charge state 305-c) as a result of an accumulation of leakage charge or bias may represent a loss of data from such leakage charge.

In accordance with examples of the present disclosure, operations may be performed on a memory section 110 to encourage or otherwise support the dissipation of leakage charge or bias from memory cells 105 of the memory section 110, which may reduce or eliminate data loss that may otherwise result from an accumulation of leakage charge or bias. For example, after access operations on selected memory cells 105 of a memory section 110, the charge state of non-selected memory cells 105 may follow at least a portion of the path 360 as a result of leakage charge caused by the access operations. According to an interval, which may be a periodic interval (e.g., a periodic section selection interval, a periodic voltage adjustment interval, a periodic dissipation interval, a periodic equalization interval), a memory controller 170 may select the memory section 110 for a voltage adjustment operation. As part of the voltage adjustment operation, cell selection components 230 of each of the memory cells 105 of the memory section 110 may be activated (e.g., by activating each of the word lines 205 associated with the memory section 110).

While the cell selection components 230 are activated, associated digit lines 210 and plate lines 215 of the memory section 110 may be coupled with voltage sources that support the dissipation of accumulated leakage charge or bias. For example, the associated digit lines 210 and plate lines 215 of the memory section 110 may be coupled with a same voltage source, or coupled with voltage sources having the same voltage (e.g., a ground voltage, a zero voltage, a non-zero voltage), or coupled with voltage sources having voltages that otherwise support the dissipation of leakage charge or bias accumulated at memory cells 105 of the memory section 110. In other words, in some examples, a zero voltage or equalized voltage may be applied across the memory cells 105, which may cause memory cells 105 to transition from a charge state 305 associated with a non-zero bias (e.g., charge state 305-e) to a charge state 305 with a zero bias (e.g., charge state 305-f), which may be referred to as a zero capacitor voltage $V_{cap}$.

In some examples, the selection of memory sections 110 for the described voltage adjustment operations may be performed according to a periodic selection interval, where such an interval corresponds to a quantity of access operations or a period of time that is associated with a relatively small loss of polarization (e.g., the difference in stored charge between the charge state 305-a and the charge state 305-f) in non-selected memory cells 105 of a memory section 110. In some examples, the relatively small loss of charge or polarization may be associated with charge states that remain determinate as to whether the associated memory cells store one logic state or another. In other words, in some examples, a logic 1 may be detected for a ferroelectric capacitor 220 at the charge state 305-a or 305-f. Thus, in some examples, the transition between charge state 305-a and charge state 305-f as a result of an accumulation of leakage charge or bias from access operations may represent data being maintained despite such leakage charge or bias. In some examples, a charge state may be determinate (e.g., may still represent a state that is detectable for a particular logic state) so long as the polarization is within 30% of a saturated polarization state.

In some examples, subsequent access operations may be performed in which non-selected memory cells 105 of a memory section 110 store the charge state 305-f. In such examples, the non-selected memory cells 105 of the memory section 110 may alternate between the charge states 305-f and 305-e as a result of a subsequent access operations on the memory section 110, and a subsequent equalization, discharge operation, or voltage adjustment operation, respectively. Accordingly, by performing the section-based dissipation, equalization, or voltage adjustment operations described herein, leakage charge or bias accumulated at memory cells 105 of a memory section 110 may be dissipated after various access operations on the memory section 110. Such dissipation or equalization may mitigate or prevent the accumulation of leakage charge or bias across successive access operations and improve the ability of the memory device 100 to maintain stored data. Further, by selecting a particular memory section 110 for such operations according to an interval (e.g., a periodic interval), a memory device 100 may operate more efficiently than when such operations are performed, for example, after each access operation.

Figure 4:
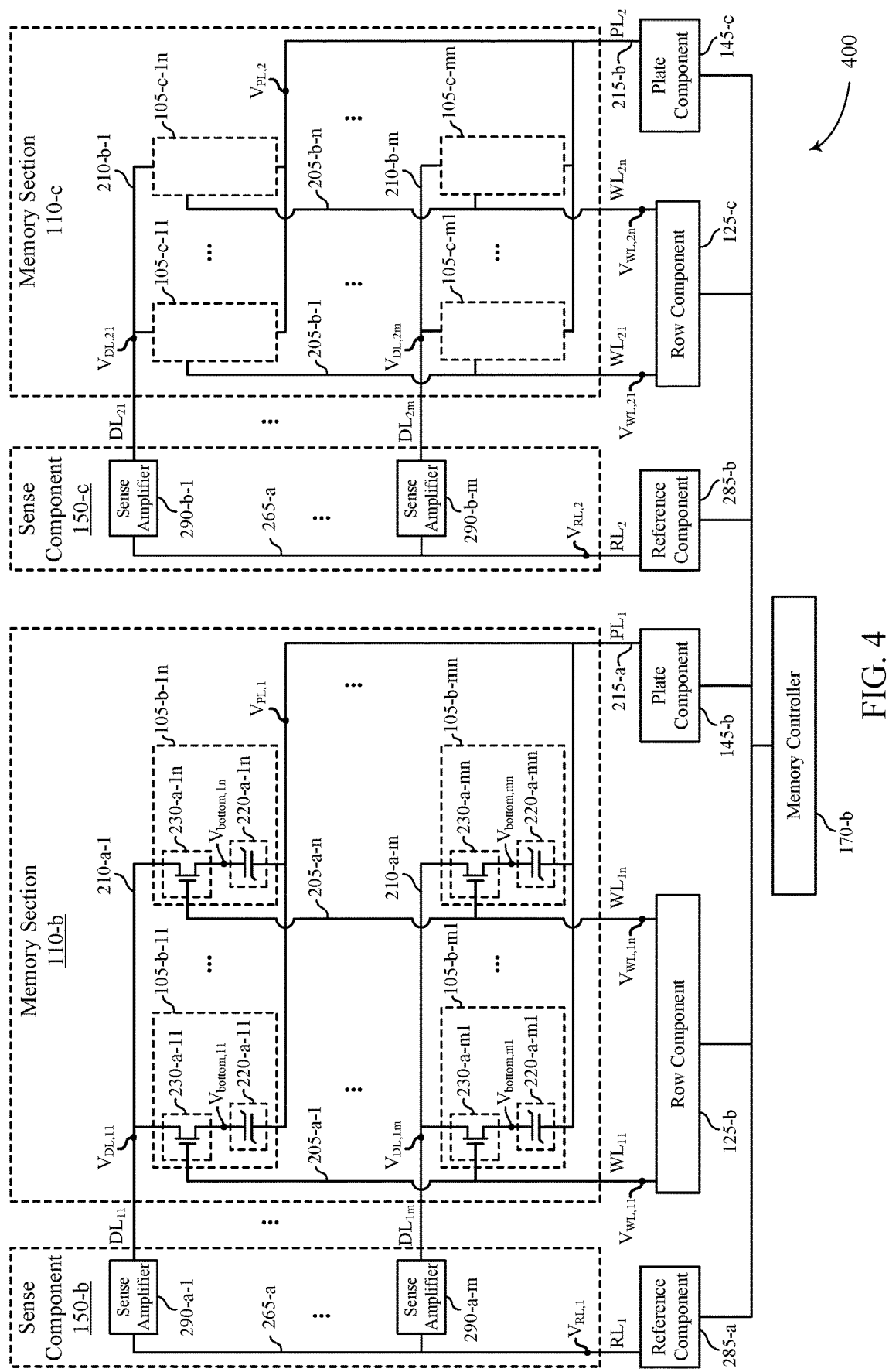
FIG. 4 illustrates an example of a circuit that supports access schemes for section-based data protection in a memory device in accordance with examples of the present disclosure.

FIG. 4 illustrates an example of a circuit 400 of a memory device that supports access schemes for section-based data protection in a memory device in accordance with various embodiments of the present disclosure. Components of the circuit 400 may be examples of the corresponding components described with reference to FIGS. 1 through 3.

The circuit 400 may include a first memory section 110-b including a first set of memory cells 105-b (e.g., memory cells 105-b-11 through 105-b-mn), which may be illustrative of an array of memory cells 105 having m columns and n rows. Each of the memory cells 105-b may be coupled with a word line 205-a of the first memory section 110-b (e.g., one of word lines 205-a-1 through 205-a-n), a digit line 210-a of the first memory section 110-b (e.g., one of digit lines 210-a-1 through 210-a-m), and a plate line 215-a of the first memory section 110-b. According to an example illustrated by circuit 400, memory cells 105-b-11 through 105-b-1n may represent a set (e.g., a column) of memory cells 105 of the first memory section 110-b that are coupled with or between a digit line of the first memory section 110-b (e.g., digit line 210-a-1) and a plate line of the first memory section 110-b (e.g., plate line 215-a). According to another example illustrated by circuit 400, memory cells 105-b-m1 through 105-b-mn may represent a set of memory cells 105 of the first memory section 110-b that are coupled with or between a different digit line of the first memory section 110-b (e.g., digit line 210-a-m) and a plate line of the first memory section 110-b (e.g., plate line 215-a).

The circuit 400 may also include a second memory section 110-c, where the components of the second memory section are simplified for illustrative purposes and clarity in this disclosure. The second memory section 110-c may include a set of memory cells 105-*c* (e.g., memory cells 105-*c*-11 through 105-*c*-*mn*), which may also be illustrative of an array of memory cells 105 having m columns and n rows. Each of the memory cells 105-*c* may be coupled with a word line 205-*b* of the second memory section 110-*c* (e.g., one of word lines 205-*b*-1 through 205-*b*-*n*), a digit line 210-*b* of the second memory section 110-*c* (e.g., one of digit lines 210-*b*-1 through 210-*b*-*m*), and a plate line 215-*b* of the second memory section 110-*c*. According to an example illustrated by circuit 400, memory cells 105-*c*-11 through 105-*c*-1*n* may represent a set (e.g., a column) of memory cells 105 of the second memory section 110-*c* that are coupled with or between a digit line of the memory section 110-*c* (e.g., digit line 210-*b*-1) and a plate line of the second memory section 110-*c* (e.g., plate line 215-*b*). According to another example illustrated by circuit 400, memory cells 105-*c*-m1 through 105-*c*-*mn* may represent a set of memory cells 105 of the second memory section 110-*c* that are coupled with or between a different digit line of the second memory section 110-*c* (e.g., digit line 210-*b*-*m*) and a plate line of the second memory section 110-*c* (e.g., plate line 215-*b*).

In the example of circuit 400, each of the memory cells 105-*b* and 105-*c* may include a respective capacitor 220 and a respective cell selection component 230. A voltage at a point (e.g., a node, an intermediate node, a terminal) between the respective capacitor 220 and the respective cell selection component 230 may be identified as a respective $V_{bottom}$, as illustrated throughout the first memory section 110-*b*. In some examples, one or more of the capacitors 220 may be ferroelectric capacitors as described herein. Each of the memory sections 110-*b* and 110-*c* may be an example of a memory section 110 that includes memory cells 105 associated with one of a plurality of word lines 205 of the section that is configured to selectively couple the memory cell 105 with one of a plurality of digit lines 210 of the section. The circuit 400 may be an example of an apparatus having memory sections 110 each including memory cells 105, digit lines 210, and word lines 205 configured to selectively couple the memory cells 105 with one of the digit lines 210. The circuit 400 may also be an example of an apparatus having a memory controller 170 operable to perform various operations of the present disclosure.

Although both the first memory section 110-*b* and the second memory section 110-*c* are illustrated as including common plate lines 215-*a* and 215-*b*, respectively (e.g., common plates for each memory section 110, a common node for each of the memory cells 105 of a memory section 110), some examples of a circuit 400 may include a separate plate lines 215-*a* or 215-*b* for each row of memory cells 105-*b* or 105-*c* (e.g., independently accessible plate lines 215 associated with each of the word lines 205) or separate plate lines 215-*a* or 215-*b* for each column of memory cells 105-*b* or 105-*c* (e.g., independently accessible plate lines 215 associated with each of the digit lines 210).

Each of the word lines 205-*a* and 205-*b* (e.g., each of the word lines $WL_{11}$ through $WL_{1n}$ and $WL_{21}$ through $WL_{2n}$) may be associated with a respective word line voltage $V_{WL}$ as illustrated, and may be coupled with a respective row component (e.g., row component 125-*b* for the first memory section 110-*b*, row component 125-*c* for the second memory section 110-*c*). The row components 125-*b* and 125-*c* may couple one or more of the word lines 205-*a* or 205-*b* with various voltage sources (not shown). For example, the row component 125-*b* may selectively couple one or more of the word lines 205-*a* with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). In another example, the row component 125-*b* may selectively couple one or more of the word lines 205-*a* with one of three voltage sources. In some examples, a first voltage source may have an idle or standby voltage (e.g., a ground voltage, a relatively small positive voltage), a second voltage source may have a selection voltage (e.g., a positive voltage greater than a ground voltage, a relatively large positive voltage), and a third voltage source may have a deselection voltage (e.g., a ground voltage, a negative voltage). Some examples may further include a word line equalization voltage source to support various operations, which may be a fourth voltage source. Other examples are possible in accordance with the present disclosure. The row component 125-*c* may couple word lines 205-*b* with voltage sources in a manner similar to the row component 125-*b*, or in a manner different from the row component 125-*b*.

Each of the digit lines 210-*a* and 210-*b* (e.g., each of the digit lines $DL_{11}$ through $DL_{1m}$ and $DL_{21}$ through $DL_{2m}$) may be associated with a respective digit line voltage $V_{DL}$ as illustrated, and may be coupled with a respective sense component 150 (e.g., sense component 150-*b*, sense component 150-*c*). In the example of circuit 400, each of the digit lines 210-*a* and 210-*b* are illustrated as direct connections between the respective memory section 110 and the respective sense component 150 (e.g., directly coupling the memory section 110-*b* with the sense component 150-*b*, directly coupling the memory section 110-*c* with the sense component 150-*c*). In other examples of circuits that support the described access schemes for section-based data protection in a memory device, additional components or elements may be coupled with or between a memory section 110 and a sense component 150, including an intrinsic capacitance 240, one or more signal development components 280, or one or more bypass lines 270, as described with reference to FIG. 2. In some examples, the circuit 400 may also include a set of signal lines $SL_{11}$ through $SL_{1m}$ or $SL_{21}$ through $SL_{2m}$, such as the signal line 260 as described with reference to FIG. 2.

Each of the one or more plate lines 215-*a* or 215-*b* (e.g., plate line $PL_1$, plate line $PL_2$) may be associated with a respective plate line voltage $V_{PL}$ as illustrated, and may be coupled with a respective plate component 145 (e.g., plate component 145-*b* for the first memory section 110-*b*, plate component 145-*c* for the second memory section 110-*c*). The plate components 145-*b* or 145-*c* may couple one or more plate lines 215-*a* or 215-*b* with various voltage sources (not shown). For example, the plate component 145-*b* may selectively couple one or more plate lines 215-*a* with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

The row component 125-*b*, the sense component 150-*b*, and the plate component 145-*b* may be configured to support various access operations (e.g., read operations, write operations, rewrite operations, refresh operations, dissipation operations, equalization operations, voltage adjustment operations) for the first memory section 110-*b*. For example, the row component 125-*b* may be configured to activate or otherwise apply a voltage to particular word lines 205-*a*. In some examples, activating a word line 205-*a* may activate the cell selection component 230-*a* for one or more of the memory cells 105-*b* that are coupled with the respective word line 205-a. For example, activating the word line 205-a-1 may activate all of the cell selection components 230-a-11 through 230-a-m1 associated with memory cells 105-b-11 through 105-b-m1 (e.g., a row of memory cells 105-b of the first memory section 110-b).

The sense component 150-b may include a set of sense amplifiers 290-a configured to detect a logic state stored by respective ones of the memory cells 105-b. In some examples, the sense amplifiers 290-a may detect a logic state stored by comparing a respective digit line voltage $V_{DL}$ with a reference line voltage $V_{RL}$, which may be provided to the sense component 150-b by a reference component 285-a (e.g., via reference line 265-a). The plate component 145-b may be configured to activate or otherwise apply a voltage to particular one or more of the plate lines 215-a. In some examples, operations associated with the row component 125-b, the sense component 150-b, the plate component 145-b, or the reference component 285-a may be controlled at least in part by the memory controller 170-b.

Similarly, the row component 125-c, the sense component 150-c, and the plate component 145-c may be configured to support various access operations (e.g., read operations, write operations, rewrite operations, refresh operations, dissipation operations, equalization operations, voltage adjustment operations) for the second memory section 110-c. In some examples, operations associated with the row component 125-c, the sense component 150-c, the plate component 145-c, or the reference component 285-b may also be controlled at least in part by the memory controller 170-b.

In the example of circuit 400, the sense components 150-b and 150-c may each include a separate sense amplifier 290 (e.g., sense amplifiers 290-a for the first memory section 110-b, sense amplifiers 290-b for the second memory section 110-c) associated with each of the respective digit lines 210-a or 210-b (e.g., a separate sense amplifier 290 for each column of memory cells 105). Each of the sense amplifiers 290-a and 290-b may be coupled with other portions of a memory device, such as a column component 135, an input/output component 160, or a memory controller 170-b (e.g., via one or more I/O lines 295, not shown). Each of the sense amplifiers 290-a and 290-b may be associated with a respective signal voltage $V_{sig}$ and a respective reference voltage $V_{ref}$, such as the associated voltages as described with reference to FIG. 2. Each of the sense amplifiers 290-a and 290-b may be coupled with a first sense amplifier voltage source (e.g., having a voltage of $V_L$, which may be a ground voltage substantially equal to $V_0$ or a negative voltage), and coupled with a second sense amplifier voltage source (e.g., having a voltage of $V_H$, which may be greater than the voltage of $V_L$), such as those described with reference to FIG. 2.

The sense components 150-b and 150-c may, in some examples, be used to latch signals associated with a read operation when detecting a logic state stored by memory cells 105-b or 150-c. For example, electrical signals associated with such latching may be communicated between the sense component 150-a (e.g., a sense amplifier 290-a) and an input/output component 160, for example, via I/O lines 295 (not shown). In some examples, the sense components 150-a and 150-b may be in electronic communication with the memory controller 170-b, which may control various operations of the sense components 150-a and 150-b. In some examples, activating a logical signal provided to a sense component 150 may be referred to as "enabling" or "activating" the sense component 150. In some examples, activating a logical signal provided to a sense component 150 may be referred to, or be part of an operation known as "latching" the result of accessing memory cells 105.

In the example of circuit 400, each of the sense amplifiers 290-a and 290-b may be selectively coupled or decoupled with various portions of the circuit 400 by various switching components. In some examples, each of the sense amplifiers 290-a and 290-b may include a switching component configured to selectively couple or decouple the respective sense amplifier 290-a or 290-b and a respective digit line 210-a or 210-b (e.g., by activating or deactivating a logical signal). In some examples, each of the sense amplifiers 290-a and 290-b may include a switching component configured to selectively couple or decouple the respective sense amplifier 290-a or 290-b and a reference source, such as the reference component 285-a or 285-b (e.g., by activating or deactivating a logical signal).

In some examples, each of the sense amplifiers 290-a and 290-b may include a switching component configured to selectively couple or decouple the respective sense amplifier 290-a or 290-b and a respective equalization voltage source (e.g., by activating or deactivating a logical signal). In some examples, an equalization voltage source may represent a common grounding point (e.g., a chassis ground, a neutral point), which may be associated with a common reference voltage having a voltage $V_0$, from which other voltages are defined.

Any one or more of the logical signals described with reference to the circuit 400 may be provided by the memory controller 170-b, which may be an example of a memory controller 170 that is shared among multiple memory sections 110. Although certain switching components may share common logical signals, any of the switching components may be activated or deactivated by a logical signal that is specific to a given switching component (e.g., a logical signal specific to a particular one of the digit lines 210-a or 210-b, a logical signal specific to a particular row of memory cells 105, a logical signal specific to a particular one of the digit lines 210-a or 210-b, a logical signal specific to a particular column of memory cells 105).

Although circuit 400 is illustrated with separate reference voltage sources (e.g., reference component 285-a, reference component 285-b), other embodiments or configurations that support the described access schemes for section-based data protection in a memory device may employ a self-referencing access scheme, where a reference voltage for reading a respective memory cell 105-b or 105-c may be provided at least in part by accessing the respective memory cell 105-b or 105-c (e.g., in a subsequent operation). In such examples, the memory cell 105-b or 150-c may be coupled with a reference node of the respective sense amplifier 290-a or 290-b.

Although the memory sections 110-a and 110-b and the sense components 150-a and 150-b are illustrated with respective dashed lines as reflecting particular boundaries, such boundaries are shown for illustrative purposes only. In other words, one or more of the memory sections 110-a and 110-b and the sense components 150-a and 150-b in accordance with the present disclosure may have boundaries different than the dashed boundaries shown in the circuit 400, and accordingly may include more or fewer components than illustrated in the example of FIG. 4.

In one example, a memory device may have more than one set of digit lines 210 coupled with a sense component 150-b, which may be selected via a column selection component or level selection component. For example, the digit lines 210-a-1 through 210-a-m of circuit 400 may illustrate a first set of digit lines (e.g., a first set of columns, a first level of columns) coupled with the sense component 150-b. Another set of digit lines (e.g., digit lines 210-c-1 through 210-c-m, not shown) may refer to a second set of digit lines (e.g., a second set of columns, a second level of columns) coupled with the sense component 150-b that may have a similar arrangement as the first set of digit lines (e.g., coupled with a different set of memory cells 105, not shown).

In some examples, a circuit of a memory device 100 may include a column selection component or level selection component between the sense component 150-b and the first and second sets of digit lines to select whether a digit line 210 of the first set of digit lines is coupled with the sense component 150-b or a digit line 210 of the second set of digit lines is coupled with the sense component 150-b. In some examples, different sets of digit lines 210 or columns may share common word lines 205. In other words, in some examples, a word line 205 may activate cell selection components 230 of memory cells 105 (e.g., rows) in different sets of digit lines 210 or columns. In some examples, different sets of digit lines 210 or columns may also share signal lines between a memory section 110 and a sense component 150 (e.g., between a sense component 150 and a column selection component or level selection component). Thus, a particular memory cell 105 may be accessed with a combination of a particular word line address, a digit line or signal line address, and a column selection or level selection address (e.g., a "Y-address").

In various examples in accordance with the present disclosure, memory cells 105 associated with the first set of digit lines and the second set of digit lines may be considered to be part of the same memory section 110 (e.g., digit lines 210-a-1 through 210-a-m and digit lines 210-c-1 through 210-c-m being included in the first memory section 110-b, digit lines 210-a-1 through 210-a-m and digit lines 210-c-1 through 210-c-m sharing a common plate line 215-a), or memory cells 105 associated with the first set of digit lines and the second set of digit lines may be considered to be part of different memory sections (e.g., digit lines 210-a-1 through 210-a-m being included in the first memory section 110-b and coupled with the plate line 215-a, and digit lines 210-c-1 through 210-c-m being included in another memory section 110-d and coupled with another plate line 215-c, not shown).

In some cases, although voltage sources may be coupled with common voltage supplies and/or grounding points, the voltage at each of the voltage sources coupled with a common voltage supply or common grounding point may be different due to various differences in the circuit 400 (e.g., conductor length, conductor width, conductor resistance, conductor or other capacitance) between the respective voltage sources and the associated common voltage supply or common grounding point.

In some examples, the first memory section 110-b may be isolated or otherwise separated from the second memory section 110-c. For example, the digit lines 210-a may be isolated from the digit lines 210-b, the plate line 215-a may be isolated from the plate line 215-b, and the word lines 205-a may be isolated from the word lines 205-b. In various examples, the row component 125-b may be separate from the row component 125-c, the plate component 145-b may be separate from the plate component 145-c, the reference component 285-a may be separate from the reference component 285-b, or the sense component 150-b may be separate from the sense component 150-c.

In some examples (e.g., when the first memory section 110-b is isolated or otherwise separated from the second memory section 110-c), an access operation performed on the first memory section 110-b may not affect the second memory section 110-c. In other words, voltages or other signals applied to the first memory section 110-b (e.g., during an access operation) may not translate into voltages or other signals being applied to the second memory section 110-c, and vice versa. Thus, leakage charge or bias may accumulate differently for different memory sections 110 of a memory device 100, and a voltage adjustment operation performed on one memory section 110 may not provide a similar effect on another memory section 110. In accordance with aspects of the present disclosure a voltage adjustment operation may be performed according to various intervals on a section-by-section basis to mitigate the accumulation of leakage charge or bias on the memory sections 110 of a memory device 100.

Figure 5:
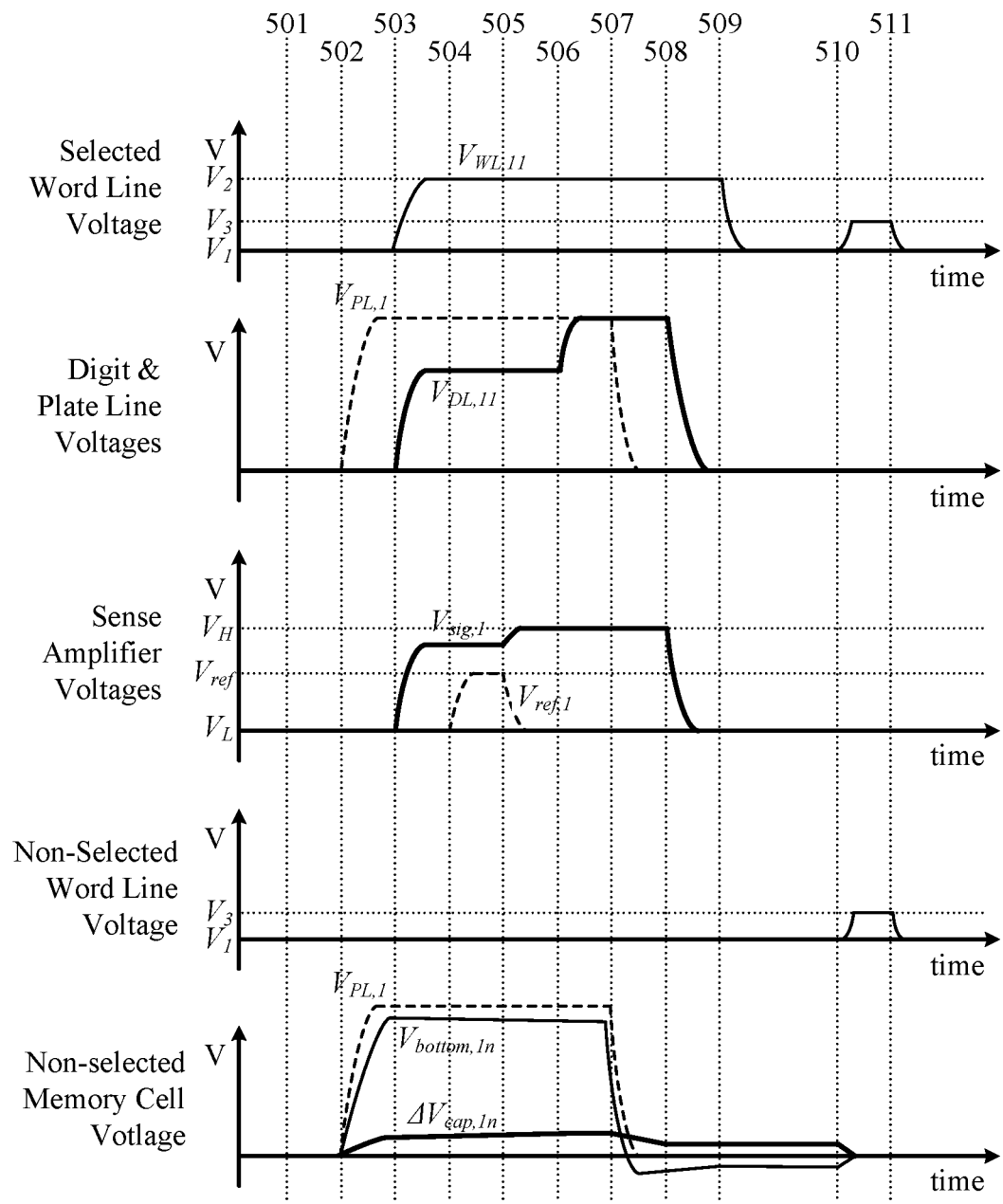
FIG. 5 shows a timing diagram illustrating operations of example access schemes for section-based data protection in a memory device in accordance with various embodiments of the present disclosure.

FIG. 5 shows a timing diagram 500 illustrating operations of an example access scheme for protecting stored data in a memory device in accordance with aspects of the present disclosure. The timing diagram 500 is described with reference to components of the example circuit 400 of FIG. 4, but may be illustrative of operations that may be performed with different circuit arrangements as well.

In the example of timing diagram 500, the memory cell 105-b-11 may be a selected memory cell 105 (e.g., a selected memory cell 105-b of the first memory section 110-b). In other words, prior to or during the operations of timing diagram 500, the memory cell 105-b-11 may be selected or otherwise identified (e.g., by the memory controller 170-b) for an access operation (e.g., a read operation, which in some examples may include or be followed by a rewrite operation) of the first memory section 110-b. Other memory cells 105-b (e.g., memory cells 105-b-12, not shown, through 105-b-1n) of the first memory section 110-b may be non-selected memory cells 105 (e.g., non-selected memory cells 105-b of a column of memory cells) in the example of timing diagram 500. In the example of timing diagram 500, the memory cell 105-b-11 may initially store a logic 1 state as described herein (e.g., with reference to FIG. 3). In the example of timing diagram 500, the non-selected memory cell 105-b-1n may also initially store a logic 1 state as described herein (e.g., with reference to FIG. 3). With regard to the described leakage resulting from access operations, non-selected memory cells 105 may be referred to as "victim cells" and selected memory cells 105 may be referred to as "aggressor cells."

In some examples, prior to initiating the operations of timing diagram 500 (e.g., during an idle period, an idle interval, a standby period, a standby interval), the digit lines 210-a and the plate line 215-a of the first memory section 110-b may be biased at the same voltage. Matching the voltage of digit lines 210-a and plate lines 215-a may minimize charge leakage in the first memory section 110-a. For example, in the example of timing diagram 500, the digit lines 210-a and the plate line 215-a of the first memory section 110-b may have an initial voltage of 0V (e.g., a ground voltage, a chassis ground voltage, an equalization voltage), which may be provided by various voltage sources (e.g., via the sense component 150-b, via the plate component 145-b, via a column component 135, via a signal development component 280). In other examples, the digit lines 210-a and the plate line 215-a may be biased at different voltages, which may or may not be equal between the digit lines 210-a and the plate line 215-a.

The timing diagram 500 may illustrate an access scheme in which the row component 125-b is configured to apply a voltage (e.g., bias) to each of the word lines 205-a of the first memory section 110-*b* one of three voltages to support the various operations described herein (e.g., for activating, deactivating, equalizing particular word lines 205-*a* or rows of the first memory section 110-*b*). To support the operations of the timing diagram 500, the row component 125-*b* may include various configurations of voltage sources, voltage supplies, switching components, selection components, amplifiers, or voltage conversion components to apply a particular voltage to particular ones of the word lines 205-*a*, which in some examples may be responsive to signals or commands from the memory controller 170-*b*.

A first voltage, $V_1$, may represent a word line idle or standby voltage. According to the example of timing diagram 500, the first voltage may, in some cases, be a ground or virtual ground voltage, and may be coupled with a same voltage supply or chassis ground as voltage sources of the sense component 150-*b* or the plate component 145-*b*, for example. The first voltage may have a value associated with deactivating cell selection components 230-*a* of the first memory section 110-*b* under certain conditions. In some examples, the first voltage may have a value of 0V, and may be referred to as VSS. In other examples, the first voltage may have a negative value for deactivating cell selection components 230, and may be referred to as VNWL.

A second voltage, $V_2$, may represent a cell access word line voltage. According to the example of timing diagram 500, the third voltage may, in some cases, be a relatively large positive voltage, and may have a magnitude large enough to activate cell selection components 230-*a* of the first memory section 110-*b* under certain conditions (e.g., for read operations, for write operations, for rewrite operations, for refresh operations). In some examples, the second voltage may be selected to have a relatively large magnitude in order to support relatively fast access operations (e.g., as compared with using a lower voltage for selecting a memory cell 105-*b* for a read operation, write operation, rewrite operation, refresh operation). In some examples, the second voltage may have a value of 3.1V, and may be referred to as VCCP.

A third voltage, $V_3$, may represent a cell equalization or dissipation word line voltage. According to the example of timing diagram 500, the third voltage may, in some cases, be a relatively small positive voltage, and may have a magnitude large enough to activate a cell selection component 230-*a* of the first memory section 110-*b* under certain conditions (e.g., for voltage adjustment operations). In some examples, the third voltage may be selected to have a relatively small magnitude in order to support voltage adjustment operations or other states with relatively low power consumption (e.g., as compared with using a higher voltage for voltage adjustment operations). In some examples, the third voltage may be selected to support a relatively low slew rate (e.g., rate of change of voltage) during the described operations. In some examples, the third voltage may have a value of 1.0V to 1.2V, and may be referred to as VPWL or Vperi.

At 501, the access operation may include various initialization operations of the first memory section 110-*b*, or otherwise associated with the first memory section 110-*b*. For example, at 501, the access operation may include selectively decoupling sense amplifiers 290-*a* of the sense component 150-*b* from respective equalization voltage sources (e.g., deactivating switching components between the sense amplifiers 290-*a* and ground voltage sources, which may include deactivating logical signals associated with the sense component 150-*b*). Thus, at 501, respective signal voltages $V_{sig}$ (e.g., voltages on the array side of the sense component 150-*b*) and reference voltages $V_{ref}$ (e.g., voltages on the reference side of the sense component 150-*b*) for the sense amplifiers 290-*a* may be at zero volts.

At 502, the access operation may include raising the voltage of the plate line 215-*a* (e.g., a common plate, a common node of memory cells 105-*b*) of the first memory section 110-*b*. For example, at 502, the plate component 145-*b* may couple the plate line 215-*a* with a voltage source having a relatively high voltage (e.g., a plate high voltage). In some examples, at 502, the plate component 145-*b* may decouple the plate line 215-*a* from a plate low voltage source (e.g., a ground voltage source, an idle plate line voltage source, a standby plate line voltage source) prior to coupling the plate line 215-*a* with the voltage source having the relatively high voltage. Thus, at 502, the plate line voltage $V_{PL,1}$ of the first memory section 110-*b* may increase from the voltage prior to 502.

In some examples, the operations of 502 may be associated with driving a leakage charge into or out of non-selected memory cells 105-*b* of the first memory section 110-*b*. For example, due to the difference in the voltage of the plate line 215-*a* and the digit line 210-*a*-1 (e.g., $V_{PL,1} - V_{DL,11}$) of the first memory section 110-*b*, leakage charge may flow across one or more of the cell selection components 230-*a*-12 (not shown) through 230-*a*-1*n* associated with the memory cells 105-*b*-12 through 105-*b*-1*n*. Accordingly, leakage charge may flow into or out of one or more of the capacitors 220-*a*-12 (not shown) through 220-*a*-1*n*, which may alter the charge state or logic state stored by one or more of the non-selected memory cells 105-*b*-12 through 105-*b*-1*n* (e.g., memory cells 105-*b* of the same column as a selected memory cell 105-*b*). For example, as compared with the charge state 305-*a* described with reference to FIG. 3, the operations of 502 may cause a ferroelectric capacitor 220-*a* of a non-selected memory cell (e.g., one or more of the memory cells 105-*b*-12 through 105-*b*-1*n*) to move along the path 360 (e.g., towards charge state 305-*e*), which may represent a partial loss of polarization of one or more of the non-selected memory cells 105-*b*-12 through 105-*b*-1*n*.

In some examples, leakage charge may be driven into or out of other non-selected memory cells 105-*b* of the first memory section 110-*b* (e.g., memory cells 105 of other columns of the first memory section 110, one more of memory cells 105-*b*-m1 through 105-*b*-*mn*) as a result of raising the voltage of the plate line 215-*a*. In some examples, raising a voltage of a plate line 215 of a memory section 110 may be associated with driving leakage charge into or out of all memory cells 105 of the memory section 110, whether a particular memory cell 105 is selected or not. For example, some amount of leakage charge may be driven into or out of the selected memory cell 105-*b*-11 as a result of raising the voltage of the plate line 215-*a* at 502 from a first voltage to a second higher voltage, before the cell selection component 230-*a*-11 is activated for a determined access operation (e.g., a word line selection operation at 503).

The leakage charge associated with such operations may be illustrated by the voltage behavior of the non-selected memory cells 105-*b* of the first memory section 110-*b* (e.g., any one or more of the memory cells 105-*b*-12 through 105-*b*-1*n*, coupled with the digit line 210-*a*-1). For example, in the absence of charge leakage, the cell bottom voltages $V_{bottom,1}$ of non-selected memory cells 105-*b*-12 through 105-*b*-1*n*, coupled with the digit line 210-*a*-1, would generally follow the plate line voltage $V_{PL,1}$. However, in the example of timing diagram 500, the cell bottom voltage $V_{bottom,1n}$ associated with the memory cell 105-*b*-1*n* (e.g., storing a logic 1) may not rise as high as the applied voltage $V_{PL}$, due to charge leakage from the cell bottom of the ferroelectric capacitor 220-a-1n through the cell selection component 230-a-1n to the digit line 210-a-1. Thus, the ferroelectric capacitor 220-a-1n (or the capacitor 220-a of any of the other non-selected memory cells 105-b-12 through 105-b-1n) may experience a change in voltage (e.g., an accumulated non-zero bias), illustrated by $\Delta V_{cap,1n}$, which may be associated with a change in charge state of the ferroelectric capacitor 220-a-1n (e.g., a transition from a charge state 305-a towards a charge state 305-e).

In some examples, leakage charge may continue to flow in the first memory section 110-b after 502, (e.g., until the voltage of the plate line 215-a and the digit line 210-a-1 are equalized after 508, until the difference in voltage of the plate line 215-a and the digit line 210-a-1 is equal to a capacitor voltage $V_{cap}$ of a ferroelectric capacitor 220-a of a respective memory cell 105-b). The change in voltage of the ferroelectric capacitor 220-a-1n may continue to be illustrated by the voltage $\Delta V_{cap,1n}$ throughout the operations of the timing diagram 500. Although leakage charge is described with reference to leakage across cell selection components 230, leakage may also be a result of coupling between intermediate nodes or cell bottoms 222 of adjacent memory cells 105 (e.g., leakage as a result of a difference between $V_{bottom,11}$ and $V_{bottom,12}$, leakage as a result of a difference between $V_{bottom,11}$ and $V_{bottom,21}$).

At 503, the operations may include a word line selection operation of the first memory section 110-b. For example, at 503, the row component 125-b may change the word line 205-a-1 associated with the selected memory cell 105-b-11 (e.g., a selected word line 205-a of the first memory section 110-b, a selected row of the first memory section 110-b) from being biased at the first voltage (e.g., $V_1$, a word line idle or standby voltage) to being biased at the second voltage (e.g., $V_2$, a cell access word line voltage). In other words, the operations of 503 may be associated with activating or selecting the word line 205-a-1 (e.g., of the first memory section 110-b), which may include causing or initiating a transition in the bias applied to the word line 205-a-1 (e.g., $V_{WL,11}$). In some examples, the operations of 503 may be accompanied by determining to access the memory cell 105-b-11 of the memory section 110-b (e.g., a determination by the memory controller 170-b), or otherwise identifying the memory cell 105-b-11 for performing an access operation. In some examples, the operations of 503 may be associated with selectively coupling the ferroelectric capacitor 220-a-11 with the digit lines 210-a-1. In some examples, the operations of 503 may be referred to as selecting the memory cell 105-b-11.

Because the word line 205-a-1 is coupled with the cell selection component 230-a-11, the cell selection component 230-a-11 may be activated as a result of the operations of 503. In other words, as a result of the operations of 503, the capacitor 220-a-11 may be selectively coupled with the digit line 210-a-1. Thus, charge may flow between the memory cell 105-b-11 and the digit line 210-a-1 based on the logic state stored by the memory cell 105-b-11 (e.g., based on a polarization state of the capacitor 220-a-11). Accordingly, in the example of the timing diagram 500, the voltage of the digit line 210-a-1 (e.g., $V_{DL,1}$) may rise as charge is shared with the digit line 210-a-1. In some examples (e.g., when the first memory section 110-b is coupled with the sense component 150-b), the signal voltage at the sense amplifier 290-a-1 (e.g., $V_{sig,1}$) may also rise and may be equal to $V_{DL,1}$ after 503. Thus, the operations of 503 may be an example of performing an access operation on the selected memory cell 105-b-11 by causing the row component 125-b (e.g., a row decoder) to activate the word line 205-a-1. In some examples, the operations of 503 may also be associated with performing an access operation on other memory cells 105 in a row of memory cells 105 (e.g., memory cells 105-b-21 through 105-b-m1).

At 504, the operations may include providing a reference voltage to the sense component 150-b. For example, at 504, the reference component 285-a may couple the reference line 265-a of the first memory section 110-b with a voltage source providing a reference voltage. The reference voltage may, in some cases, be selected as a value (e.g., an average) between the signal voltage generated when reading a memory cell 105-b that stores a logic 0 (e.g., $V_{sig}$ when reading a logic 0) and the signal voltage generated when reading a memory cell 105-b that stores a logic 1 (e.g., $V_{sig}$ when reading a logic 1). In some examples, at 504, the access operation may include the reference component 285-a decoupling the reference line 265-a from a ground voltage source prior to coupling the reference line 265-a with the voltage source providing the reference voltage. Thus, at 504, the voltage of the reference line 265-a (e.g., $V_{RL,1}$) may increase from the voltage prior to 504 (e.g., an idle or standby reference line voltage). In some examples, the reference voltage at the sense amplifier 290-a-1 (e.g., $V_{ref,1}$) may also rise and may be equal to $V_{RL,1}$ after 504. In other examples of access schemes that support self-referencing read operations (not shown), the illustrated operations at 504 may be replaced with one or more operations that develop a reference signal using the memory cell 105-b-11 (e.g., using a selected memory cell 105-b).

At 505, the operations may include latching the result of detecting the logic state stored by the memory cell 105-b-11. For example, at 505, the sense amplifiers 290-a may be activated (e.g., by activating a logical signal to the sense component 150-b), which may couple the sense amplifier 290-a-1 with a high sense amplifier voltage source (e.g., a voltage source at a voltage $V_H$) and may couple the sense amplifier 290-a-1 with a low sense amplifier voltage source (e.g., a voltage source at a voltage $V_L$). In some examples, the operations at 505 may include isolating (e.g., decoupling) the sense amplifier 290-a from the first memory section 110-b (e.g., by deactivating the switching component between the sense amplifiers 290-a and the first memory section 110-b), which may isolate a signal node 291 of the sense amplifier 290-a-1 from the memory cell 105-b-11. In some examples, the operations at 505 may include isolating (e.g., decoupling) the sense amplifiers 290-a from the reference component 285-a (e.g., by deactivating a switching component between the sense amplifiers 290-a and the reference component 285-a), which may isolate a reference node 292 of the sense amplifier 290-a-1 from the reference component 285-a. In some examples, isolating the sense amplifiers 290-a from the first memory section 110-b or the reference component 285-b or both may be performed before activating the sense amplifiers 290-a.

In the example of timing diagram 500, where $V_{sig,1}$ is greater than $V_{ref,1}$ at 505, the $V_{sig,1}$ may rise to the voltage $V_H$ and $V_{ref,1}$ may fall to the voltage $V_L$ as a result of the operations of 505. The voltages of $V_{sig,1}$ or $V_{ref,1}$ (e.g., $V_H$ or $V_L$) may be provided as an output of the sense component 150-b (e.g., to a column component 135, to an input/output component 160, to the memory controller 170-b). In some examples, any one or more of the operations of 501 through 505 may be referred to as a read operation.

At 506, the operations may include coupling the sense amplifier 290-a-1 with the first memory section 110-b. For example, at 506, the operations may include activating a switching component between the sense amplifier 290-a-1 and the first memory section 110-b, which may couple a signal node 291 of the sense amplifier 290-a-1 with the memory cell 105-b-11. Accordingly, the voltage of the digit line 210-a-1 (e.g., $V_{DL,11}$) may rise to voltage of the high sense amplifier voltage source (e.g., $V_H$), which in some examples may also be the voltage of the plate line high voltage source (e.g., as activated at 502).

At 507, the operations may include lowering the voltage of the plate line 215-a of the first memory section 110-b. For example, at 507, the plate component 145-b may couple the plate line 215-a with a voltage source having a relatively low voltage (e.g., a plate line low voltage, a ground voltage, a virtual ground voltage). In some examples, at 507, the plate component 145-b may decouple the plate line 215-a from a voltage source having a relatively high voltage prior to coupling the plate line 215-a with the voltage source having the relatively low voltage. Thus, at 507, the plate line voltage may drop from the voltage prior to 507 (e.g., returning to an idle or standby plate line voltage).

In some examples, the operations of one or both of 506 or 507 may be referred to as a rewrite operation, or be otherwise included in a rewrite operation of the memory cell 105-b-11. For example, at 507, the voltage applied across the ferroelectric capacitor 220-a-11 (e.g., $V_{cap}$) may be equal to the difference between the voltage of the digit line 210-a-1 (e.g., $V_{DL,11}$) and the plate line 215-a (e.g., $V_{PL,1}$) of the first memory section 110-b. In some examples, the voltage applied across the ferroelectric capacitor 220-a-11 may correspond to the voltage 315 described with reference to FIG. 3, which may correspond to a positive saturation voltage. In other words, the operations of one or both of 506 and 507 may be associated with rewriting the memory cell 105-b-11 with a logic 1 state (e.g., returning the memory cell 105-b-11 to the logic state stored prior to the operations of timing diagram 500). Thus, after the operations of 507, the ferroelectric capacitor 220-a-11 may be positively saturated. In other examples, the operations of any one or more of 501 through 507, including a rewrite operation, may be referred to as a single access operation (e.g., a "read-plus-rewrite" operation). In some examples, operations of one or both of 506 or 507 may be performed separately from a read operation, and may alternatively be referred to as a "write" operation.

In some examples, the operations of 507 may also be associated with driving a leakage charge into non-selected memory cells 105. For example, due to the difference in the voltage of the digit line 210-a-1 and the plate line 215-a (e.g., $V_{DL,11}-V_{PL,1}$) of the first memory section 110-b, leakage charge may flow across one or more of the cell selection components 230-a-12 through 230-a-1n of the memory cells 105-b-12 through 105-b-1n (e.g., of a column of memory cells 105-b of the first memory section 110-b). Accordingly, leakage charge may flow into one or more of the capacitors 220-a-12 through 220-a-1n, which may alter the logic state stored by one or more of the non-selected memory cells 105-b-12 through 105-b-1n of the first memory section 110-b.

In some examples, the leakage charge associated with the operations of 507 may flow in a direction opposite from a flow of leakage charge associated with the operations of 502. In other words, as compared with the charge state 305-e described with reference to FIG. 3, the operations of 507 may cause a ferroelectric capacitor 220-1 of a non-selected memory cell (e.g., one or more of the memory cells 105-b-12 through 105-b-1n) to move towards the charge state 305-f. In some examples, leakage charge or bias may continue to accumulate after 507, (e.g., until the voltage of the plate line 215-a and the digit line 210-a-1 are equalized after 508, until the difference in voltage of the plate line 215-a and the digit line 210-a-1 of the first memory section 110-b is equal to a capacitor voltage $V_{cap}$ of a respective memory cell 105-b).

At 508, the operations may include equalizing the input nodes of the sense amplifiers 290-a. For example, at 508, the operations may include activating switching components between the sense amplifiers 290-a and respective equalization voltage sources, which may selectively couple the sense amplifiers 290-a with the respective equalization voltage sources. In some examples, the operations at 508 may include deactivating the sense component 150-a (e.g., deactivating the sense amplifiers 290-a before equalizing the input nodes of the sense amplifiers 290-a). For example, deactivating the sense component 150-b at 508 may include decoupling the sense amplifiers 290-a from a high sense amplifier voltage source (e.g., a voltage source at a voltage $V_H$) and decoupling the sense amplifiers 290-a from a low sense amplifier voltage source (e.g., a voltage source at a voltage $V_L$). Thus, at 508, the signal voltages $V_{sig}$ and reference voltages $V_{ref}$ for the sense amplifiers 290-a may be biased at zero volts. In some examples (e.g., when the sense component 150-b is coupled with the first memory section 110-b), each of the digit lines 210-a may also be biased at zero volts as a result of the operations of 508.

In some examples, the operations at 508 may include coupling the sense amplifiers 290-a with the reference component 285-a. For example, the operations at 508 may include activating switching components between the sense amplifiers 290-a and the reference component 285-a, which may selectively couple a reference node 292 of the sense amplifiers 290-a with the reference component 285-a. In some examples, the reference component 285-a may couple the reference line 265-a with a ground voltage source before or after coupling the sense amplifiers 290-a with the reference component 285-a.

At 509, the operations may include deactivating the selected word line 205-a-1. For example, at 509, the row component 125-b may change the selected word line 205-a-1 from being biased at the second voltage (e.g., $V_2$, the cell access word line voltage) to being biased at the first voltage (e.g., $V_1$, a word line idle or standby voltage). In some examples, the operations of 509 may be associated with selectively decoupling the ferroelectric capacitors 220-a-11 from the respective digit line 210-a-1.

Although illustrated as separate operations occurring at different times, certain operations may occur simultaneously, concurrently, or in a different order.

In some examples, various operations may be advantageously initiated simultaneously to reduce the amount of time for sensing a logic state of the memory cell 105-b. For example, any two or more of raising the voltage of the plate line 215-a at 502, activating the word line 205-a-1 at 503, or providing a reference voltage to the sense component 150-a at 504, may occur in a different relative order, occur during overlapping durations, or occur simultaneously.

Additionally or alternatively, isolating the sense amplifier 290-a-1 from the first memory section 110-b and isolating the sense amplifiers 290-a from the reference component 285-a may occur in a different order, occur during overlapping durations, or occur simultaneously. Additionally or alternatively, coupling the sense amplifier 290-a-1 with the first memory section 110-b and lowering the voltage of the plate line 215-a at 507 may occur in a different order, occur during overlapping durations, or occur simultaneously. Additionally or alternatively, any two or more of equalizing the input nodes of the sense amplifiers 290-*a*, coupling the sense amplifiers 290-*a* with the reference component 285-*a*, or deselecting the word line 205-*a*-1 at 509 may occur in a different relative order, occur during overlapping durations, or occur simultaneously.

As illustrated by the cell bottom voltage of a non-selected memory cell 105-*b* (e.g., $V_{bottom,1n}$) after 509, a cell selection component 230-*a* of non-selected memory cells 105-*a* (e.g., one or more of the memory cells 105-*b*-12 through 105-*b*-1*n*, other memory cells 105 of other columns) may be deactivated, but leakage charge may nonetheless flow through the respective deactivated cell selection components 230-*a* during an access operation associated with the selected memory cell 105-*b*-11 (e.g., during the operations of any one or more of 501 through 509). In the example of ferroelectric memory cells 105-*b*, the leakage charge or bias may accumulate at the ferroelectric capacitors 220-*a* of the non-selected memory cells 105-*b*, which may alter the polarization of the ferroelectric capacitors 220-*a* (e.g., as illustrated by the non-zero value of $\Delta V_{cap,1n}$ after 509).

For example, when the ferroelectric capacitor 220-*a*-1*n* of non-selected memory cell 105-*b*-1*n* is at a charge state 305-*a* (e.g., storing a logic 1), leakage charge or bias associated with an access operation on the selected memory cell 105-*b*-11 may cause the charge state of the non-selected memory cell 105-*b*-1*n* to follow at least a portion of the path 360 described with reference to FIG. 3. In some examples, a first access operation (e.g., one or more of the operations of 501 through 509) on the selected memory cell 105-*b*-11 may cause the ferroelectric capacitor 220-*a*-1*n* the memory cell 105-*b*-1*n* to approach or reach the charge state 305-*e* described with reference to FIG. 3, which may correspond to the level of the voltage $\Delta V_{cap,1n}$.

In the event that non-selected memory cell 105-*b*-1*n* remains as non-selected for subsequent access operations (e.g., following the operations of 509, not shown) for other selected memory cells 105-*b* of the first memory section 110-*b*, the charge state of memory cell 105-*b*-1*n* may continue along the path 360 as leakage charge or bias continues to accumulate, until reaching charge state 305-*c* described with reference to FIG. 3, for example (e.g., accumulating a larger $\Delta V_{cap}$). The charge state 305-*c* may illustrate a substantial loss of polarization, which may illustrate a loss of data at the memory cell 105-*b*-1*n* from such accumulated leakage charge or bias. In an illustrative example, for a memory device 100 that performs access operations every 150 nanoseconds, 100 microseconds may be equivalent to around 667 access operations. In some examples, the cumulative leakage across successive access operations may be on the order of hundreds of millivolts over a time period of tens or hundreds of microseconds, depending on the leakage characteristics of the circuit 400. However, operations may be performed after access operations on selected memory cells 105-*b* (e.g., after the operations of one or more of 501 through 509) to encourage or otherwise support the dissipation of leakage charge or bias from the non-selected memory cells 105-*b*, which may reduce or eliminate data loss that may otherwise result from an accumulation of leakage charge or bias.

For example, at 510, the operations may include activating each of the word lines 205-*a*-1 through 205-*a*-*n* of the first memory section 110-*b* (e.g., for a voltage adjustment operation). For example, at 510, the row component 125-*b* may change from each of the word lines 205-*a* being biased at the first voltage (e.g., $V_1$, a word line idle or standby voltage) to being biased at the third voltage (e.g., $V_3$, a cell equalization or dissipation word line voltage). In some examples, the operations of 510 may be associated with selectively coupling each of the ferroelectric capacitors 220-*a* with the respective digit lines 210-*a* (e.g., with a relatively low magnitude selection voltage).

In some examples, each of the digit lines 210-*a* and the plate line 215-*a* may be biased at a same voltage (e.g., a ground voltage). Thus, as a result of the operations of 510, each of the ferroelectric capacitors 220-*a* may be equalized (e.g., because the respective cell selection components 230-*a* were activated by the word line idle or standby voltage). Thus, the operations of 510 may be an example of performing a voltage adjustment operation on one or more of the memory cells 105-*b*-11 through 105-*b*-*mn* by causing the row component 125-*b* (e.g., a row decoder) to activate one or more of the word lines 205-*a* (e.g., dissipating any accumulated leakage charge or bias on the memory cells 105-*b*). Accordingly, after the operations of 510, each of the ferroelectric capacitors 220-*a* may be returned to an equalized state (e.g., having a respective capacitor voltage $V_{cap}=0V$).

At 511, the operations may include idling each of the word lines 205-*a*-1 through 205-*a*-*n*. For example, at 511, the row component 125-*b* may change from each of the word lines 205-*a* being biased at the third voltage (e.g., $V_3$, a cell equalization or dissipation word line voltage) to being biased at the first voltage (e.g., $V_1$, a word line idle or standby voltage). In some examples, the operations of 511 may be associated with selectively decoupling each of the ferroelectric capacitors 220-*a* with the respective digit lines 210-*a* (e.g., with a relatively low magnitude selection voltage). In some examples, the operations of 510 and 511 may be referred to collectively as a voltage adjustment operation.

As illustrated by the cell bottom voltage of the memory cells 105-*b* after 511, an accumulated leakage charge or bias (e.g., at the non-selected memory cell 105-*b*-1*n*) may be dissipated (e.g., as illustrated by the zero value of $\Delta V_{cap,1-n}$ at the end of the timing diagram 500). Thus, as illustrated by the example of timing diagram 500, operations may be performed after access operations on selected memory cell 105 (e.g., any one or more of the operations 501 through 509) to encourage or otherwise support the dissipation of leakage charge from non-selected memory cells 105, which may reduce or eliminate data loss that may otherwise result from an accumulation of leakage charge or bias.

The order of operations shown in the timing diagram 500 is for illustration only, and various other orders and combinations of steps may be performed in accordance with the present disclosure. Further, the timing of the operations of the timing diagram 500 is also for illustration purposes only, and is not meant to indicate a particular relative duration between one operation and another. Various operations may occur over a duration or time interval that is relatively shorter or relatively longer than illustrated in various embodiments of access schemes for section-based data protection in a memory device in accordance with the present disclosure.

The transitions of the logical signals of the timing diagram 500 are illustrative of transitions from one state to another, and generally reflect transitions between a disabled or deactivated state (e.g., state "0") and an enabled or activated state (e.g., state "1") as associated with a particular numbered operation. In some examples, the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based on characteristics of the associated logical signal, including the voltage level of the logical signal or the transition characteristics of the logical signal itself. Thus, the transitions shown in the timing diagram 500 are not necessarily indicative of an instantaneous transition. Further, the initial state of a logical signal associated with a transition at a numbered operation may have been arrived during various times preceding the numbered operation while still supporting the described transitions and associated operations. Although logical signals are described as a transition between logical states, the voltage of a logical signal may be selected to operate a component at a particular working point (e.g., in an active region or in a saturation region), and may be the same as, or different from a voltage of other logical signals.

A row component 125 may be configured in various ways to support the operations of timing diagram 500. For example, a row component 125 may be designed such that applying a positive selection voltage to a selected one of the word lines 205 during an access operation is explicitly accompanied by applying a negative deselection voltage to each of the non-selected word lines 205 (e.g., with or without applying an intervening ground voltage before applying a selection or deselection voltage) during the access operation.

In another example, a row component 125 may be designed such that applying a positive selection voltage to a selected one of the word lines 205 during an access operation is explicitly accompanied by applying a ground or 0V deselection voltage to each of the non-selected word lines 205 during the access operation. In another example, a row component 125 may be designed for applying a positive selection voltage to a single selected one of the word lines 205 during an access operation, without applying a deselection voltage to each of the non-selected word lines 205 during the access operation. In some examples, a row-component may separately apply a selection or other activation voltage to each of the word lines 205 perform a voltage adjustment operation on each of the word lines 205.

Although the described operations for equalizing or dissipating an accumulated charge or bias (e.g., the operations of 510 and 511) are illustrated in the timing diagram 500 as occurring after a particular access operation (e.g., based on performing at least one access operation), a memory device in accordance with examples of the present disclosure may perform such operations (e.g., voltage adjustment operations) according to other periods or intervals on a section-by-section basis (e.g., among memory sections 110 of a memory device 100, among memory sections 110 of one of a set of banks in a memory device 100). By selecting a particular memory section 110 for such operations according to such periods or intervals, a memory device may operate more efficiently than when such operations are performed, for example, after each access operation.

Figure 6A:
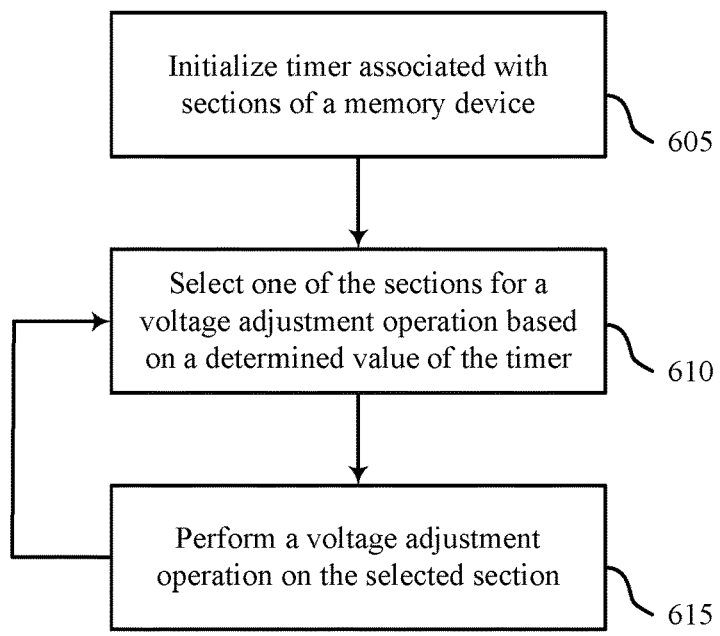
FIGS. 6A and 6B show flowcharts illustrating a method or methods that may support access schemes for section-based data protection in a memory device in accordance with various embodiments of the present disclosure.
Figure 6B:
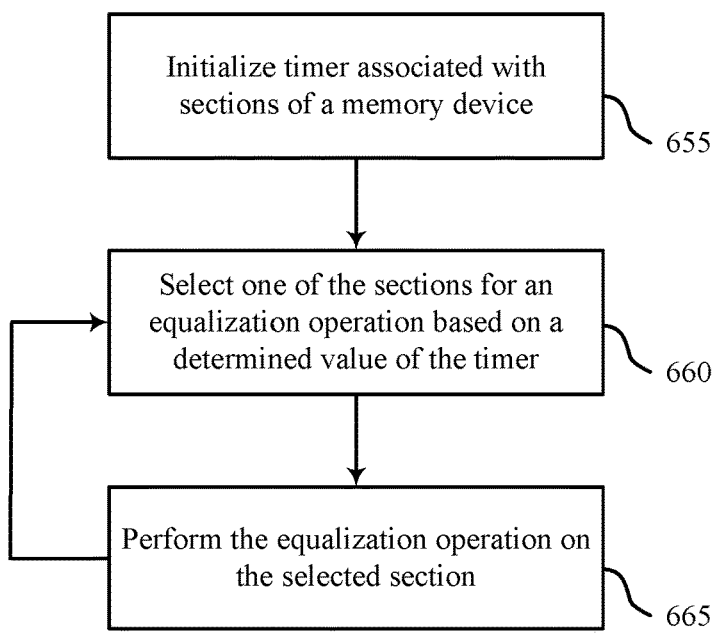

FIGS. 6A and 6B show flowcharts illustrating a method 600-a and a method 600-b that may support access schemes for section-based data protection in a memory device in accordance with various embodiments of the present disclosure. The operations of the methods 600-a and 600-b may be performed according to the methods and apparatuses described with reference to FIGS. 1 through 5. In some examples, the operations of methods 600-a or 600-b may be implemented by one or more components illustrated in a memory device 100, a circuit 200, or a circuit 400. For example, operations of methods 600-a or 600-b may be performed at least in part by a memory controller 170, one or more row components 125, other components of a memory device 100, or various combinations thereof as described with reference to FIGS. 1 through 5. In some examples, a memory device 100, or one or more subcomponents thereof (e.g., a memory controller 170), may execute a set of instructions to control the functional elements of the device (e.g., voltage supplies, logical signals, transistors, amplifiers, switching components, selection components) to perform the functions described below. Additionally or alternatively, the memory device 100, or one or more subcomponents thereof, may perform some or all of the functions described below using special-purpose hardware. In some examples, method 600-a or method 600-b may be performed by a memory device 100 having memory cells 105 that include ferroelectric capacitors 220. The method 600-a or the method 600-b may be referred to as implementing a Wordline-Only Refresh (WOR).

The method 600-a may be an example of performing a voltage adjustment operation (e.g., a dissipation operation, an equalization operation) in accordance with examples of the present disclosure.

At 605, the method 600-a may include initializing a timer associated with sections (e.g., a set of memory sections 110) of a memory device 100. As used herein, a set of memory sections 110 may refer to all of the memory sections 110 of a memory device 100, all of the memory sections 110 of a particular subset of memory sections 110 of a memory device 100, all of the memory sections 110 of a particular bank of memory sections 110 of a memory device 100, or other sets of memory sections 110 (e.g., sets of memory sections 110 that may support performing separate instances of the method 600-a or the method 600-b).

In some examples, the timer may be dedicated to voltage adjustment operations (e.g., dissipation operations, equalization operations). In other examples, the timer may refer to a general-purpose clock or timer of a memory controller 170, a general-purpose clock or timer of some other component of a memory device 100, or a timer or clock of a device that includes the memory device 100 (e.g., a processor clock of a computer that includes the memory device). In some cases, initializing a timer associated with sections of a memory device 100 may refer to a memory controller 170 establishing a connection with, or otherwise receiving or identifying a signal associated with a general-purpose timer or clock, such as receiving timer or clock information, or cycles of a general-purpose clock, via a bus of the memory device 100. In various examples, the timer may count time in units of seconds, in units of clock cycles, or any other temporal unit. In some example, the timer may be referred to as a counter, and may be used to generally track a periodic interval.

In some examples, the operations of 605 may include a different type of counter, such as a counter that tracks a total number of access operations performed on a memory device 100. Such a counter may accumulate a count of any access operation performed by the memory device (e.g., on all memory sections 110 of the memory device, of a certain subset of memory sections 110 of the memory device), or such a counter may accumulate a count of certain types of access operations (e.g., only read operations, only write operations, only write and rewrite operations, only precharge operations). Thus, in various examples, the method 600-a may be performed according to temporal intervals or non-temporal voltage adjustment intervals.

At 610 the method 600-$a$ may include selecting one of the sections (e.g., one of the memory sections 110 of the memory device 100) for a voltage adjustment operation (e.g., an equalization operation, a dissipation operation) based on a determined value of the timer (or counter). For example, referring to components of the circuit 400, at 610 the memory controller 170-$b$ may determine to perform a voltage adjustment operation (e.g., of a memory device 100 that includes the circuit 400) based on a determined value of a timer (e.g., of the memory controller 170-$b$, of another component of the memory device 100). According to various examples of the present disclosure, the memory controller 170-$b$ may subsequently apply various criteria to select either the first memory section 110-$b$ or the second memory section 110-$c$ for a voltage adjustment operation.

In some examples, a determined value of the timer may be representative of or based on a duration or other interval since the memory device 100 was powered on (e.g., when determining a first voltage adjustment operation after powering a memory device 100). Additionally or alternatively, a determined value of the timer may be representative of or based on a duration or other interval since a prior voltage adjustment operation was performed. A duration of such a timer may be fixed (e.g., predetermined, preconfigured, static), or a duration of such a timer may be variable (e.g., dynamic, calculated based on operating conditions, determined based on an operating mode or operating state).

In some examples, the operations at 610 may include determining to select one of the memory sections 110 for a voltage adjustment operation based on a total number of access operations performed on the memory device 100 or bank of the memory device 100 (e.g., since a prior voltage adjustment operation was performed). Thus, in some examples, section selection operations may be triggered after a determined quantity of access operations of a memory device 100 or a bank of the memory device 100 (e.g., a quantity of a particular type of access operation across all memory sections 110 of a memory device 100, a quantity of a particular set of access operation types across all memory sections 110 of a memory device 100), such as after every ten access operations of the memory device 100, every one hundred access operations of the memory device 100, every thousand access operations of the memory device 100, and so on.

In various examples, a selection based on a determined quantity of access operations of a memory device 100 may be an alternative to a selection based on a periodic interval associated with a timer, or may be combined with a selection based on a periodic interval associated with a timer. For example, the operations at 610 may include determining to select a memory section 110 for a voltage adjustment operation based the earlier of an elapsed duration since a prior voltage adjustment operation or a total number of access operations performed by the memory device 100 since a prior voltage adjustment operation exceeding a threshold. The operations at 610 may be referred to as, or may include determining to select a memory section 110 for performing a voltage adjustment operation, a dissipation operation, or an equalization operation (e.g., based on a value of a timer, based on a value of a counter, based on a number of access operations performed on all of the memory sections 110 of a memory device 100).

In some examples, a determined value of the timer or counter (e.g., a voltage adjustment interval, a duration between voltage adjustment operations) may be based on an operating mode of a memory device 100, where some operating modes may be associated with a shorter or longer duration between voltage adjustment operations than other operating modes. In various examples, an interval between voltage adjustment operations may be selected or calculated based on one or more operating conditions such as access rate, voltage states, logic states, operating temperatures, power consumption, or others, or some combination thereof. For example, in a high-speed access mode, where relatively many access operations are being performed by a memory device 100 in a given amount of time, a determined value of a timer or counter (e.g., a voltage adjustment operation interval) associated with the described voltage adjustment operations may be shortened (e.g., dynamically, in response to a change in operating mode) to mitigate data loss from potential leakage charge or bias. In a low-power access mode, which may be associated with relatively few access operations being performed by a memory device 100 in a given amount of time, an interval between voltage adjustment operations may be lengthened (e.g., dynamically, in response to a change in operating mode) to reduce power consumption (e.g., power consumption associated with activating word lines 205 or equalizing a bias across memory cells 105).

In another example, a memory device 100 may detect conditions where memory cells 105 may be more sensitive to leakage charge or bias. Such conditions may include conditions where non-selected cell selection components 230 may permit more leakage, conditions where bias across non-selected memory cells 105 may be higher, conditions where memory storage elements of memory cells 105 may be more susceptible to loss of polarization, and others. A memory device 100 may accordingly operate in a mode associated with the heightened sensitivity to leakage charge or bias. In such a mode, the memory device 100 may use a shortened voltage adjustment interval to mitigate data loss from potential leakage charge or bias.

According to various examples of the present disclosure, various criteria may be used for selecting a particular memory section 110 for performing a voltage adjustment operation (e.g., after determining to perform a voltage adjustment operation, after determining to select a memory section 110 for performing a voltage adjustment operation). In some examples, upon a timer reaching a determined value, a memory controller 170 may select a memory section 110 for a voltage adjustment operation based on an order (e.g., a sequential order, a defined order, a predetermined order) for adjusting memory sections 110 of the memory device 100. Such an approach may be referred to as a "round robin" or "blind round robin" selection, and may be configured to accommodate an ordered or sequential cycling through as many memory sections 110 are included in a memory device 100, or a number of memory sections 110 included in a defined portion of a memory device 100.

In some examples, the method 600-$a$ or the method 600-$b$ may include identifying such an order for adjusting or equalizing the sections of the memory device 100 (e.g., prior to 610), and selecting memory sections 110 for a voltage adjustment operation (e.g., at 610) may be based on the identified order for adjusting or equalizing the memory sections 110. A section selection order may be based on or defined according to an arrangement of memory sections 110 in a memory device 100. A section selection order may be stored in a memory controller 170 (e.g., predefined, written, pre-loaded), or determined by a memory controller 170 (e.g., calculated, identified based on an ordering rule, identified based on a memory section 110 associated with a previous voltage adjustment operation). In various examples, a section selection order may be determined on startup or initialization of a memory device 100, or may be determined dynamically (e.g., based on an operating mode, based on operational characteristics, based on a dynamic determination of sets of memory sections 110 for performing voltage adjustment operations).

In some examples, a section selection order may consider a spatial arrangement of memory sections 110 in a memory device 100 (e.g., along a lateral dimension of a memory array, along a thickness dimension of a memory array), where a section selection order follows a sequence of memory sections 110 along one or more spatial directions (e.g., a first memory section 110, followed by a second memory section 110 along a spatial direction, followed by a third memory section 110 along the spatial direction). Additionally or alternatively, a section selection order may consider a logical (e.g., numbered) arrangement of memory sections 110 in a memory device 100, where a section selection order follows a sequential order in accordance with the logical arrangement (e.g., following an order of increasing logical numbers or other numeric identification of memory sections 110). In various examples a spatial arrangement and a logical arrangement may or may not be equivalent.

In some examples, a section selection order may consider a spatial or logical arrangement of memory sections, but the order may not follow a linear or increasing/decreasing order. For example, a section selection order may start with a second memory section 110, followed by a first memory section 110, followed by a third memory section 110 (e.g., according to a spatial arrangement, according to a logical arrangement).

In some examples, identifying an order for adjusting or equalizing memory sections 110 may include determining a random order according to an arrangement of memory sections 110 (e.g., of a set of memory sections 110, for a set of voltage adjustment operations). In various examples, a section selection order may be identified or defined based on particular electronic characteristics for performing a voltage adjustment operation (e.g., charge dissipation characteristics, oscillatory signal characteristics, signal or voltage stability).

An interval between voltage adjustment operations according to a round robin approach may be set or defined such that the voltage adjustment operations are performed on respective memory sections 110 quickly enough to handle a heavy burst of access operations on a particular memory section 110.

In some examples, a round robin approach may be applied to different subsets of memory sections 110 of a memory device 100, which may include a first memory controller 170 performing aspects of voltage adjustment operations according to an order of a first subset of the memory sections 110, and a second memory controller 170 performing aspects of voltage adjustment operations according to an order of a second subset of the memory sections 110. In some examples, aspects of performing voltage adjustment operations according to different orders of different subsets of memory sections 110 may be performed by a same memory controller 170.

In some examples, upon a timer reaching a determined value, a memory controller 170 may select a memory section 110 for a voltage adjustment operation based on a memory section 110 associated with a most recently performed access operation. For example, a memory controller 170 may store or maintain a record or indication of a memory section 110 that has been most recently read, most recently written, most recently rewritten, most refreshed, or most recently accessed by any of a set of access operations. Such a stored indication may be updated each time such an access operation is performed on a memory device 100. Upon determining to perform a voltage adjustment operation (e.g., based on a timer, based on a total number of access operations of a memory device 100), a memory controller 170 may select, for the voltage adjustment operation, the memory section 110 that has been most-recently accessed.

An approach that selects a most recently accessed memory section 110 may be referred to as a "row hammer" approach, and may be configured to accommodate a selection from as many memory sections 110 are included in a memory device 100, or a number of memory sections 110 included in a defined portion of a memory device 100. In other words, like a round robin approach, a row hammer approach may also be applied to different subsets of memory sections 110 of a memory device 100, which may include a first memory controller 170 performing aspects of voltage adjustment operations according to a most recently accessed memory section 110 of a first subset of the memory sections 110, and a second memory controller 170 performing aspects of voltage adjustment operations according to a most recently accessed memory section 110 of a second subset of the memory sections 110. In some examples, aspects of performing voltage adjustment operations according to different accessing of different subsets of memory sections 110 may be performed by a same memory controller 170.

At 615 the method 600-a may include performing a voltage adjustment operation (e.g., an equalization operation, a dissipation operation) on the selected section (e.g., a selected memory section 110). For example, at 615, the memory device 100 may perform aspects of the operations of 510 and 511 described with reference to the timing diagram 500 of FIG. 5 and the circuit 400 of FIG. 4. (e.g., selecting or activating word lines of the selected memory section 110, equalizing a bias across memory cells 105 of the memory section 110). In other words, in some examples, the operations of 610 described with reference to method 600-a (e.g., selecting a memory section 110 for a voltage adjustment operation) may occur between the operations of 509 and 510 described with reference to timing diagram 500 (e.g., after performing one or more access operations on a memory cell 105 of a memory section 110, before performing a voltage adjustment operation). Thus, in some examples the operations of 610 may refer to a decision or trigger to perform the operations of 509 and 510 of the timing diagram 500.

In some examples, performing the voltage adjustment operation at 615 may include activating each of the plurality of word lines 205 or each of the cell selection components 230 of the selected memory section 110. In some examples, the voltage adjustment operation may include a memory controller (e.g., memory controller 170) activating switching components (e.g., cell selection components 230) associated with respective ones of the memory cells 105 of the selected memory section 110 to couple storage elements (e.g., capacitors 220) of each of the memory cells 105 of the selected memory section 110 with an access line (e.g., a digit line 210) of the selected memory section 110.

In some examples, activating the word lines 205 or the cell selection components 230 at 615 includes applying a selection bias (e.g., via word lines 205) with a magnitude that is less than a selection bias associated with an access operation. For example, access operations such as read or write operations may be associated with a relatively high magnitude word line voltage or cell selection voltage (e.g., a second voltage $V_2$, VCCP, 3.1V). In comparison, activating word lines 205 or cell selection components 230 for a voltage adjustment operation at 615 may be associated with a relatively low magnitude word line voltage or cell selection voltage (e.g., a third voltage $V_3$, VPWL, Vperi, 1.0V to 1.2V). Thus, a voltage adjustment operation of 615 may include applying a selection voltage having a magnitude that is less than a selection voltage associated with an access operation.

In some examples, the operations at 615 may be associated with performing an equalization operation on the selected memory section 110 by equalizing a bias or voltage across storage elements (e.g., capacitors 220) of each of the memory cells 105 of the selected memory section 110. Performing the equalization operation may include selectively coupling each of the memory cells 105 of the selected memory section 110 with an access line (e.g., a digit line 210) of the selected memory section 110 by activating cell selection components 230 associated with respective ones of the memory cells 105 of the selected memory section 110.

In some examples, equalizing the bias across a respective one of the memory cells 105 may include biasing a digit line 210 coupled with the respective memory cell 105 to a ground voltage and biasing a common node (e.g., a plate line 215, a plate component 145) coupled with the respective memory cell 105 to the ground voltage. In some examples, equalizing the bias across a respective one of the memory cells 105 may include biasing a digit line 210 that is coupled with the respective memory cell 105 to a non-zero voltage and biasing a common node (e.g., a plate line 215, a plate component 145) coupled with the respective memory cell 105 to the non-zero voltage. In some examples, equalizing the bias across a respective one of the memory cells 105 may include coupling a digit line 210 coupled with the respective memory cell 105 and a common node (e.g., a plate line 215, a plate component 145) coupled with the respective memory cell 105 to a same voltage source (e.g., a chassis ground, a ground voltage source, an equalization voltage source).

The operations of 510 and 511 described with reference to the timing diagram 500 of FIG. 5 may illustrate an example of a voltage adjustment operation where each of the word lines 205-a of the first memory section 110-b are activated simultaneously (e.g., at 510) and deactivated simultaneously (e.g., at 511). However, in other examples, activation or deactivation of word lines 205 in a voltage adjustment operation of a memory section 110 may occur in different orders or arrangements. For example, various voltage adjustment operations may include activating or deactivating each of the word lines 205 or cell selection components 230 of a selected memory section 110 concurrently or simultaneously, or activating or deactivating each of the set word lines 205 of the selected memory section 110 section according to a sequential word line order. In another example, a voltage adjustment operation may include activating a first subset of the of word lines 205 during a first time period and activating a second subset of the word lines 205 during a second time period that is different (e.g., starting at a different time, having a different duration, non-overlapping, overlapping) from the first time period.

For example, with reference to the circuit 400 of FIG. 4, to activate each of the word lines 205-a of the first memory section 110-b in a sequential order, the activation may include activating word line 205-a-1, then activating word line 205-a-2, and so on, until activating word line 205-a-n. The activations of such a sequential ordering may occur in time intervals that are overlapping (e.g., where the word line 205-a-2 begins an activation before an activation of the word line 205-a-1 is complete) or non-overlapping (e.g., where the word line 205-a-2 begins an activation after an activation of the word line 205-a-1 is complete). To deactivate all of the word lines 205-a of the first memory section 110-b, such a deactivation may also occur in a sequential order, which may be the same as or different from an activation order. Like the activations discussed above, the deactivations of such a sequential ordering may also occur in time intervals that are overlapping (e.g., where the word line 205-a-2 begins a deactivation before a deactivation of the word line 205-a-1 is complete) or non-overlapping (e.g., where the word line 205-a-2 begins a deactivation after a deactivation of the word line 205-a-1 is complete).

In some examples in accordance with the present disclosure, a voltage adjustment operation may combine the activation or selection of word lines 205 with an activation or selection of digit lines 210. For example, when a memory device 100 has multiple levels or other subsets of digit lines 210 of a memory section 110 that may be selected with a level selection component or column selection component, the levels or other subsets of digit lines 210 of the memory section 110 may also be selected or activated as part of a voltage adjustment operation. In some examples, the levels or other subsets of digit lines 210 of the memory section 110 may each be selected or activated according to a sequential order, and may be selected or activated (e.g., iterated through, switched between) at a same rate or different rate as an activation of word lines 205 of the operation.

In one example, a voltage adjustment operation may be performed according to a "WL-fast, DL-slow" activation configuration. In other words, the described operations may cycle through activating word lines 205 relatively quickly, and digit lines 210 or sets of digit lines 210 relatively slowly. In one example, a voltage adjustment operation may include activating each of the word lines 205 or rows of a first level (e.g., subset of digit lines 210, subset of columns), then activating each of the word lines 205 or rows of a second level, and so on. In examples where different subsets of digit lines 210 or different subsets of columns share common word lines, a voltage adjustment operation may include cycling through activations of each of the common word lines 205 while a first subset of digit lines 210 or subset of columns is activated, then repeating the cycling through activations of each of the common word lines 205 while a second subset of digit lines 210 or subset of columns is activated, and so on, until activating each of the common word lines 205 while a last subset of digit lines 210 or subset of columns is activated. Other examples are possible, such as a voltage adjustment operation performed according to a "DL-fast, WL-slow" activation configuration.

Following the operations of 615, the method 600-a may return to 610 for a determination to perform a subsequent voltage adjustment operation, and subsequent selection of a memory section 110 for the voltage adjustment operation. In other words, a memory device 100 may cycle between the operations of 610 and 615 in an iterative manner to perform voltage adjustment operations throughout the operation of the memory device 100. In some examples, following the operations of 615, or as part of the operations of 615, a voltage adjustment timer or counter may be reset, such that the timer or counter may accumulate time or counts over a new voltage adjustment interval prior to repeating the operations of 610. In other words, after performing the operations of 615, returning to 610 may be based on or triggered by a value of a voltage adjustment operation timer or counter.

The method 600-b may be another example of performing a voltage adjustment operation (e.g., a dissipation operation, an equalization operation) in accordance with examples of the present disclosure. The method 600-*b* illustrates examples of variations that may be included in a voltage adjustment operation, and may include other variations of a voltage adjustment operation described with reference to the method 600-*a* that are not repeated below.

At 655, the method 600-*b* may include initializing a timer associated with sections (e.g., a set of memory sections 110) of a memory device 100. As used herein, a set of memory sections 110 may refer to all of the memory sections 110 of a memory device 100, all of the memory sections 110 of a particular subset of memory sections 110 of a memory device 100, all of the memory sections 110 of a particular bank of memory sections 110 of a memory device 100, or other sets of memory sections 110 (e.g., sets of memory sections 110 that may support performing separate instances of the method 600-*a* or the method 600-*b*).

At 660 the method 600-*b* may include selecting one of the sections (e.g., one of the memory sections 110 of the memory device 100) for an equalization operation (e.g., an equalization operation, a dissipation operation) based on a determined value of the timer (or counter). For example, referring to components of the circuit 400, at 610 the memory controller 170-*b* may determine to perform an equalization operation based on a determined value of a timer (e.g., of the memory controller 170-*b*, of another component of the memory device 100). According to various examples of the present disclosure, the memory controller 170-*b* may subsequently apply various criteria (e.g., a selection according to a section selection order, a selection of a most-recently accessed memory section 110) to select either the first memory section 110-*b* or the second memory section 110-*c* for an equalization operation.

At 665 the method 600-*b* may include performing an equalization operation on the selected section (e.g., a selected memory section 110). In some examples, performing the equalization operation may include equalizing a bias (e.g., voltage) across storage elements (e.g., capacitors 220) of each of the memory cells 105 of the selected section. For example, at 665, the memory device 100 may perform aspects of the operations of 510 and 511 described with reference to the timing diagram 500 of FIG. 5 and the circuit 400 of FIG. 4. (e.g., selecting or activating word lines of the selected memory section 110, equalizing a bias across memory cells 105 of the memory section 110). In other words, in some examples, the operations of 660 described with reference to method 600-*b* (e.g., selecting a memory section 110 for an equalization operation) may occur between the operations of 509 and 510 described with reference to timing diagram 500 (e.g., after performing one or more access operations on a memory cell 105 of a memory section 110, before performing an equalization operation). Thus, in some examples the operations of 660 may refer to a decision or trigger to perform the operations of 509 and 510 of the timing diagram 500.

Following the operations of 665, the method 600-*b* may return to 660 for a determination to perform a subsequent equalization operation, and subsequent selection of a memory section 110 for the equalization operation. In other words, a memory device 100 may cycle between the operations of 660 and 665 in an iterative manner to perform equalization operations throughout the operation of the memory device 100. In some examples, following the operations of 665, or as part of the operations of 665, an equalization timer or counter may be reset, such that the timer or counter may accumulate time or counts over a new equalization interval prior to repeating the operations of 660. In other words, after performing the operations of 665, returning to 660 may be based on or triggered by a value of an equalization operation timer or counter.

In some examples, a memory device 100 may concurrently or simultaneously perform voltage adjustment operations according to a round robin approach and perform voltage adjustment operations according to a row hammer approach (e.g., performing a first instance of the method 600-*a* or 600-*b* according to a round robin approach while also performing a second instance of the method 600-*a* or 600-*b* according to a row hammer approach). For example, a memory controller 170 may perform a first voltage adjustment cycle according to a round robin approach in order to set or define a maximum duration between voltage adjustment operations on a given memory section 110, and also perform a second voltage adjustment cycle according to a row hammer approach in order to perform voltage adjustment operations more often on recently-accessed memory sections 110. In such examples, the performance of respective voltage adjustment operations of different voltage adjustment cycles may occur simultaneously, according to the same voltage adjustment intervals but staggered so that respective voltage adjustment operations do not occur simultaneously, or according to different voltage adjustment intervals. In some examples, a memory device 100 may perform a first instance of the method 600-*a* for a first set of memory sections 110, while also performing a second instance of the method 600-*a* for a second set of memory sections 110, where the first and second instances may be performed according to the same approach or configuration, or a different approach or configuration.

In some examples, voltage adjustment operations (e.g., dissipation operations, equalization operations, operations of the method 600-*a*, operations of the method 600-*b*) may be scheduled to occur at intervals (e.g., periodic section selection intervals, aperiodic section selection intervals), but may be canceled or overridden if an access operation (e.g., one or more access operations using the word lines 205 associated with the voltage adjustment operation) is being performed on a memory section 110 identified for a voltage adjustment operation.

It should be noted that the methods 600-*a* and 600-*b*, and their variations described above, illustrate possible implementations, and that the operations and the steps may be rearranged or otherwise modified, and that other implementations are possible in accordance with the present disclosure. Further, different instances of the described methods may be performed (e.g., by a same memory device) simultaneously, during overlapping time periods, or during non-overlapping time periods. In some examples, different instances of the described methods performed by a same memory device 100 may include performing substantially the same method (e.g., on different memory sections 110, on different sets of memory section 110) or performing substantially different methods (e.g., on different memory sections 110, on different sets of memory section 110).

Figure 7:
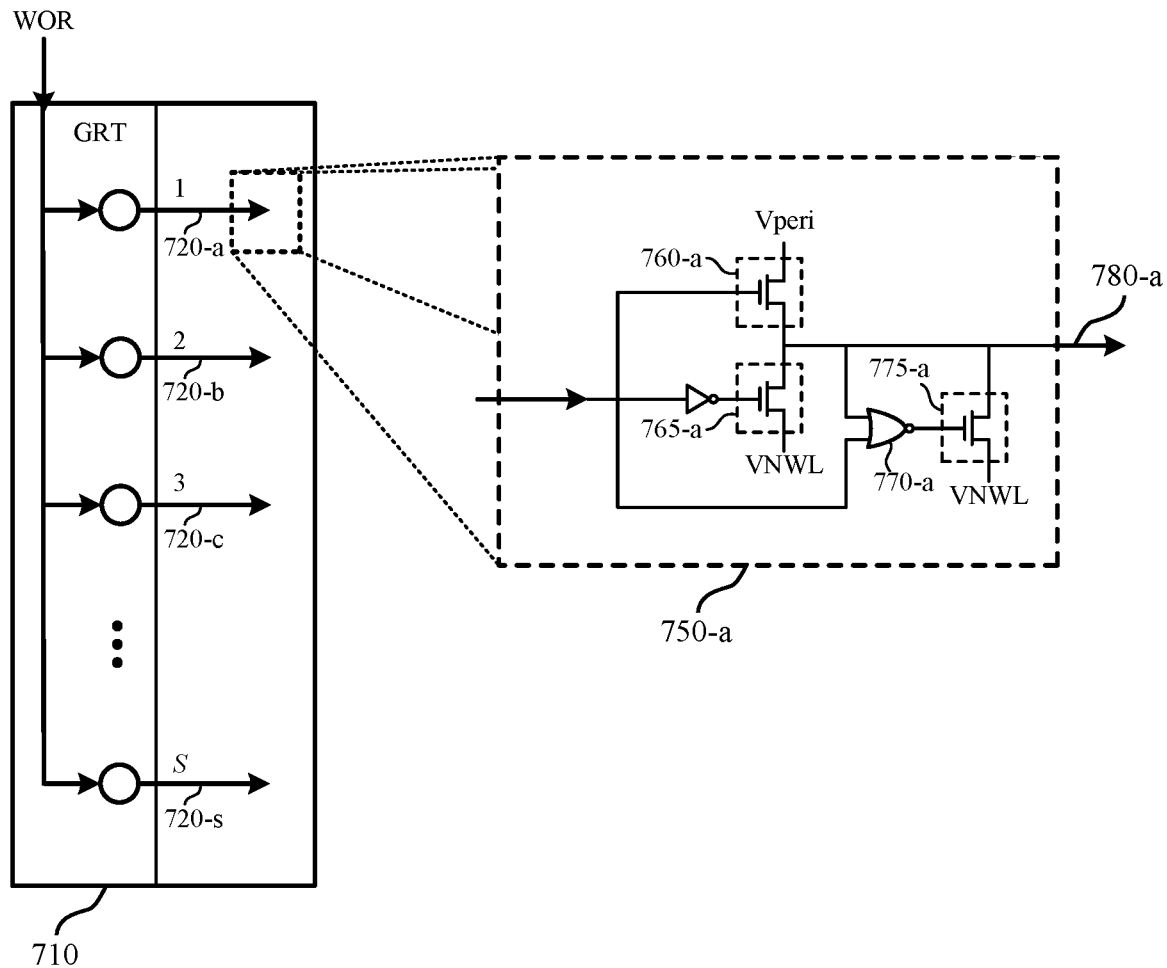
FIG. 7 is an example that illustrates circuits that support access schemes for section-based data protection in a memory device in accordance with examples of the present disclosure.

FIG. 7 illustrates a circuit 700 including an example of a section decoder 710 that supports protecting stored data in a memory device in accordance with examples of the present disclosure. In some examples, the circuit 700 may be included in a memory device, such as memory device 100 described with reference to FIG. 1. In some examples, the circuit 700 may be a component of another circuit, such as circuit 400 described with reference to FIG. 4. In some examples, the section decoder 710 may be included in a memory controller 170, and such a section decoder 710 or memory controller 170 may be repeated for each "core" of memory in a memory device 100.

The section decoder 710 may receive control signals for various voltage adjustment operations, which may include a signal "WOR" that refers to a Wordline-Only Refresh operation (e.g., a voltage adjustment operation). The signal WOR may be a toggled signal indicating that a determination has been made (e.g., by a memory controller 170) to perform a voltage adjustment operation on one of the memory sections 110 of a memory device 100. The signal WOR may include an indication of an address of a particular memory section 110 (e.g., a selected memory section 110) for a voltage adjustment operation, or the signal WOR may be accompanied by another signal that provides such an indication of a memory section 110. The signal WOR may trigger a section activation signal for a particular memory section 110 that has been selected for the voltage adjustment operation, which in some examples may be used to selectively provide a particular voltage for being coupled with the word lines 205 of the selected memory section 110 (e.g., to support the activation of cell selection components 230 for the voltage adjustment operation).

For example, the section decoder 710 may be associated with S memory sections 110 of a memory device 100, which may be all of the memory sections 110 of the memory device 100, or may be a subset of the memory sections 110 of the memory device 100. The section decoder 710 may include a separate control line 720 for each of the S memory sections 110 (e.g., control lines 720-a through 720-s). The section decoder 710 may receive an activated WOR signal when a voltage adjustment operation is to be performed on one of the S memory sections, and the section decoder 710 may subsequently provide an activated section activation signal for the selected one of the memory sections 110 via the associated control line 720. In some examples, the section decoder 710 may also provide a deactivated section activation signal for non-selected ones of the memory sections 110 via the associated control lines 720.

In some examples, the section decoder 710 may include a variable voltage source 750 for each of the associated memory sections 110, and each of the variable voltage sources 750 may receive the section activation signal for the respective section via a respective control line 720. For example, a variable voltage source 750-a may be associated with a first memory section 110, and may receive a section activation signal for the first memory section 110 via the first control line 720-a. Although the variable voltage sources 750 are illustrated as being a part of the section decoder 710, in other examples, a variable voltage source 750 for a respective memory section 110 may be included in a row component 125 that may be associated with the respective memory section 110.

When the first memory section 110 has been selected for a voltage adjustment operation, the variable voltage source 750-a may receive an activated section activation signal via the control line 720-a. The activated section activation signal may be received at the gate of a transistor 760-a, which may selectively couple an output 780-a of the variable voltage source 750-a with a voltage "Vperi." The voltage Vperi may represent a voltage for activating word lines 205 or cell selection components 230 during a voltage adjustment operation (e.g., a third voltage $V_3$), and may have a voltage that is less than a voltage associated with access operations. The output 780-a at a voltage Vperi may be provided to a row component 125 for the selected memory section 110, such that word lines 205 of the memory section 110 may be activated with the voltage Vperi during a voltage adjustment operation.

When the first memory section 110 has not been selected for a voltage adjustment operation, the variable voltage source 750-a may receive a deactivated section activation signal via the control line 720-a. The deactivated section activation signal may be inverted and received at the gate of a transistor 765-a, which may selectively couple the output 780-a of the variable voltage source 750-a with a voltage "VNWL." The voltage VNWL may represent a voltage for deactivating word lines 205 or cell selection components 230 (e.g., a first voltage $V_1$), and may have a ground voltage or a negative voltage that is associated with standby or deselected state of cell selection components 230 of the memory device 100. The output 780-a at a voltage VNWL may be provided to a row component 125 for the memory section 110, such that word lines 205 of the memory section 110 may be deactivated or deselected with the voltage VNWL (e.g., during a standby state, during an interval when a voltage adjustment operation is being performed on a different memory section 110).

In some examples, to support access operations of a memory section 110, a row component 125 for the memory section 110 may selectively couple respective word lines 205 of the memory section 110 with either the voltage VNWL (e.g., as provided via an output 780) when the respective word lines 205 are deselected or deactivated during an access operation, or a different selection voltage (e.g., a second voltage $V_2$, a voltage with a magnitude that is higher than Vperi) when the respective word lines 205 are selected or activated during the access operation). The different selection voltage may be provided by a different component (e.g., a row component 125, a common high voltage source of a memory device 100), which may be a component outside the section decoder 710.

In some examples, the transistors 760 and 765 may be relatively weak drivers, which may support a relatively slow slew rate (e.g., rate of change of voltage at the output 780). For example, relatively weak transistors 760 may provide a relatively slow voltage ramp to the voltage Vperi. In some examples, the variable voltage sources 750 may also include a NOR gate 770 coupled with the gate of another transistor 775, which may provide another selective coupling between the output 780-a with the voltage VNWL. The transistors 775 may be relatively strong drivers, which may support a relatively fast slew rate under certain transitions. For example, relatively strong transistors 775 may provide a relatively fast voltage ramp to the voltage VNWL.

Thus, the circuit 700 may be an example of selectively providing different voltages (e.g., Vperi or VNWL) to memory sections 110 based on whether a respective memory section 110 has been selected for a voltage adjustment operation. Other examples of section decoders or variable voltage sources may be implemented to support the described section-based voltage adjustment operations, and associated components may be distributed in various manners between a memory controller 170, a row component 125, or other portions of a memory device 100.

Figure 8:
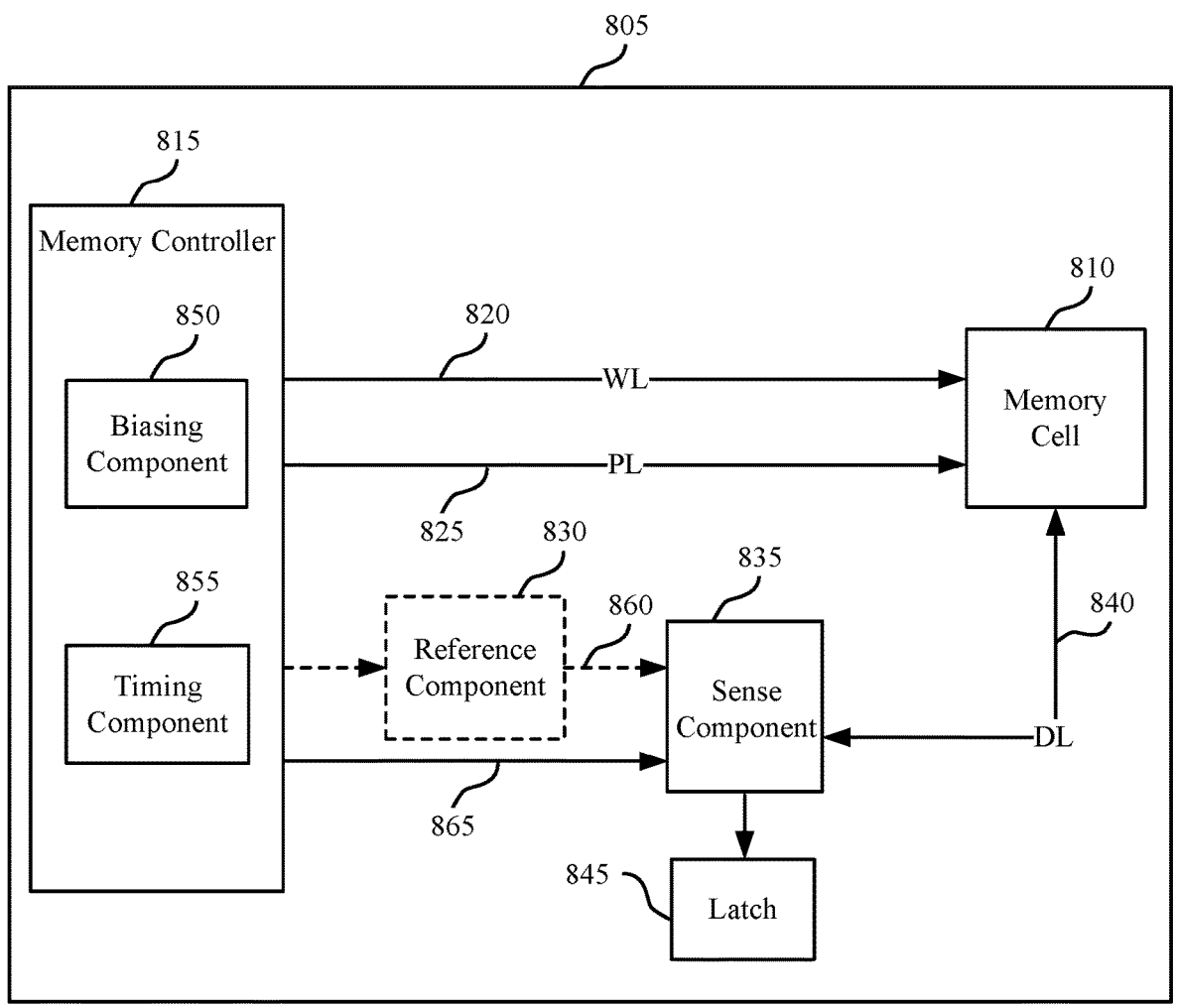
FIG. 8 shows a block diagram of a memory device that may support access schemes for section-based data protection in a memory device in accordance with various embodiments of the present disclosure.

FIG. 8 shows a block diagram 800 of a memory device 805 that may support access schemes for section-based data protection in a memory device in accordance with various embodiments of the present disclosure. The memory device 805 may be referred to as an electronic memory apparatus, and may be an example of a component of a memory device 100 as described with reference to FIG. 1.

The memory device 805 may include one or more memory cells 810, which may be an example of memory cells 105 (e.g., of a memory section 110) described with reference to FIGS. 1 through 7. The memory device 805 may also include a memory controller 815, a word line 820, a plate line 825, a sense component 835, and a digit line 840. These components may be in electronic communication with each other and may perform one or more of the functions described herein in accordance with aspects of the disclosure. In some cases, the memory controller 815 may include a biasing component 850 and a timing component 855.

The memory controller 815 may be in electronic communication with the word line 820, the plate line 825, the digit line 840, and the sense component 835, which may be examples of a word line 205, a plate line 215, a digit line 210, and a sense component 150 described with reference to FIGS. 1 through 7. In some examples, the memory device 805 may also include a latch 845, which may be an example of an I/O component 160 as described herein. The components of the memory device 805 may be in electronic communication with each other and may perform embodiments of the functions described with reference to FIGS. 1 through 7. In some cases, the sense component 835 or latch 845 may be components of memory controller 815.

In some examples, the digit line 840 may be in electronic communication with the sense component 835 (e.g., via a signal development component 280, via a bypass line 270, as described herein) and a ferroelectric capacitor of a memory cell 810. A memory cell 810 may be writable with a logic state (e.g., a first or second logic state). The word line 820 may be in electronic communication with the memory controller 815 (e.g., a row decoder of the memory controller 815) and a cell selection component of a memory cell 810 (e.g., a switching component, a transistor). The plate line 825 may be in electronic communication with the memory controller 815 and a plate of the ferroelectric capacitor of a memory cell 810. The sense component 835 may be in electronic communication with the memory controller 815, the digit line 840, and the latch 845. In some examples, a common access line may provide the functions of a signal line and a reference line. The sense control line 865 may be in electronic communication with the sense component 835 and the memory controller 815. These components may also be in electronic communication with other components, inside, or outside, or both of the memory device 805, in addition to components not listed above, via other components, connections, or busses.

The memory controller 815 may be an example of a memory controller 170 as described herein, and may be configured to activate the word line 820, the plate line 825, or the digit line 840 by applying voltages to various nodes. For example, the biasing component 850 may be configured to apply a voltage to operate the memory cell 810 to read or write the memory cell 810 as described above. In some examples, the memory controller 815 may include one or more of a row component 125, a column component 135, or a plate component 145, or may otherwise perform one or more operations described with reference to row components 125, column components 135, or plate components 145, or may otherwise communicate with a row component 125, a column component 135, a plate component 145, or a combination thereof, as described with reference to FIGS. 1 through 7, which may enable the memory controller 815 to access one or more memory cells 810. The biasing component 850 may provide voltages (e.g., voltage sources) for coupling with the memory cell 810. Additionally or alternatively, the biasing component 850 may provide voltages (e.g., voltage sources) for the operation of the sense component 835 or the reference component 830.

In some cases, the memory controller 815 may perform one or more of its operations using the timing component 855. For example, the timing component 855 may control the timing of the various word line selections or plate biasing, including timing for switching and voltage application to perform the memory functions, such as reading and writing, discussed herein (e.g., in accordance with operations described with reference to timing diagram 500 of FIG. 5). In some cases, the timing component 855 may control the operations of the biasing component 850. In some cases, the timing component 855 may include a timer associated with memory sections 110 of the memory device 805.

The sense component 835 may compare a sense signal from the memory cell 810 (e.g., via digit line 840) with a reference signal (e.g., from the reference component 830 via reference line 860, from the memory cell 810). Upon determining the logic state, the sense component 835 may then store the output in the latch 845, where it may be used in accordance with the operations of an electronic device that may include the memory device 805. The sense component 835 may include one or more amplifiers in electronic communication with the latch and the ferroelectric memory cell.

The memory controller 815, or its sub-components, may be implemented in hardware, code (e.g., software, firmware) executed by a processor, or any combination thereof. If implemented in code executed by a processor, the functions of the memory controller 815, or its sub-components, may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The memory controller 815, or its sub-components, may be physically located at various positions, including being distributed such that portions of functions are implemented at different physical locations by one or more physical devices. In some examples, the memory controller 815, or its sub-components, may be a separate and distinct component in accordance with various embodiments of the present disclosure. In other examples, the memory controller 815, or its sub-components, may be combined with one or more other hardware components, including but not limited to an I/O component, a transceiver, a network server, another computing device, one or more other components described in the present disclosure, or a combination thereof in accordance with various embodiments of the present disclosure. The memory controller 815 may be an example of the memory controller 1015 described with reference to FIG. 10.

In some examples, the memory controller 815, including any subcomponents thereof, may support the described examples of access schemes for section-based data protection in the memory device 805. For example, the memory device 805 may include a plurality of memory cells 810 coupled with the digit line 840 and the plate line 825. In some examples, each of the plurality of memory cells 810 may include a cell selection component configured to selectively couple the respective one of the plurality of memory cells with the digit line 840. The memory device may include a plurality of word lines 820, each coupled with the cell selection component of the respective one of the plurality of memory cells. The memory device 805 may also include a row decoder coupled with each of the plurality of word lines, which may be included in the memory controller 815, or may be a separate component in communication with the memory controller 815.

In accordance with embodiments of the present disclosure, the memory controller 815 may be operable to perform voltage adjustment operations on memory sections 110 of the memory device 805. In some examples, the memory controller 815 may perform such operations by causing the row decoder to activate each of the word lines 820 of a selected memory section 110. In some examples, the memory controller 815 may perform such operations by equalizing a bias across storage elements (e.g., ferroelectric capacitors) of each of the memory cells 810 of the selected memory section 110.

Figure 9:
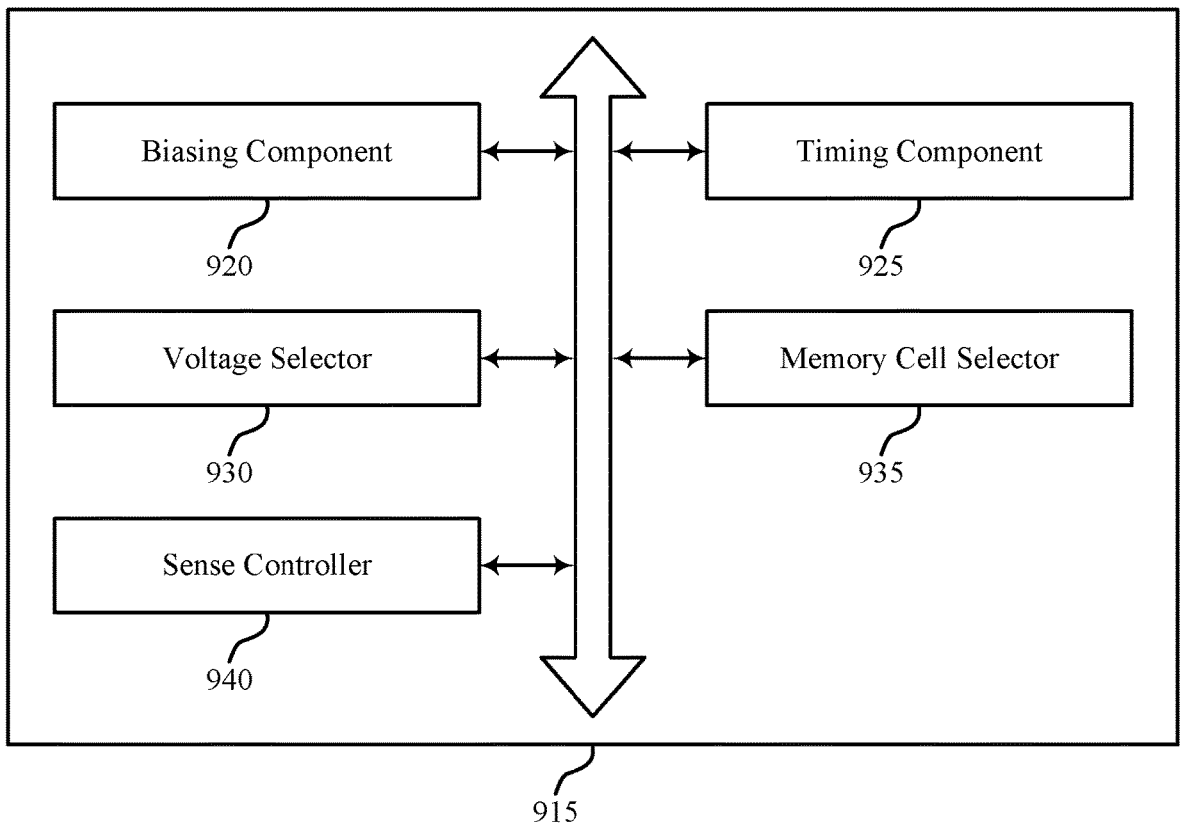
FIG. 9 shows a block diagram of a memory controller that may support access schemes for section-based data protection in a memory device in accordance with various embodiments of the present disclosure.

FIG. 9 shows a block diagram 900 of a memory controller 915 that may support access schemes for section-based data protection in a memory device in accordance with various embodiments of the present disclosure. The memory controller 915 may be an example of a memory controller 170 described with reference to FIG. 1 or a memory controller 815 described with reference to FIG. 8. The memory controller 915 may include a biasing component 920 and a timing component 925, which may be examples of biasing component 850 and timing component 855 described with reference to FIG. 8. The memory controller 915 may also include a voltage selector 930, a memory cell selector 935, and a sense controller 940. Each of these modules may communicate, directly or indirectly, with one another (e.g., via one or more buses).

The voltage selector 930 may initiate the selection of voltage sources to support various access operations of a memory device. For example, the voltage selector 930 may generate or trigger control signals used to activate or deactivate various switching components or voltage sources, such as the control signals provided to the section decoder 710 described with reference to FIG. 7, or control signals that may be provided to row components 125, plate components 145, sense components 150, or reference components 285-a as described with reference to FIGS. 1 through 5. For example, the voltage selector 930 may generate one or more of the logical signals for selecting (e.g., enabling, disabling) the voltages of word lines 205, digit lines 210, or plate lines 215 as illustrated in timing diagram 500 of FIG. 5.

The memory cell selector 935 may select a memory cell for access operations (e.g., read operations, write operations, rewrite operations, refresh operations, equalization operations, dissipation operations). In some examples, the memory cell selector 935 may generate logical signals used to activate or deactivate a memory section 110 of a memory device. In some examples, the memory cell selector 935 may generate logical signals used to activate or deactivate a cell selection component, such as cell selection components 230 described with reference to FIGS. 2 through 5. In some examples, the memory cell selector 935 may initiate or otherwise control the word line voltages $V_{WL}$ illustrated in timing diagram 500 of FIG. 5.

The sense controller 940 may control various operations of a sense component, such as the sense components 150 described with reference to FIGS. 1 through 5. For example, the sense controller 940 may generate logical signals (e.g., isolation signals) used to activate or deactivate a sense component isolation component, such as the switching components between a sense component 150 and a memory section 110 or reference component 285 described with reference to FIGS. 4 and 5. In some examples, the sense controller 940 may generate logical signals (e.g., equalization signals) used to equalize nodes of a sense component 150 or of an access line. In some examples, the sense controller 940 may generate logical signals used to couple or decouple a sense component with a sensing voltage source, or to couple or decouple a sense component with an input/output component 160 or a latch 845. Thus, in some examples, the sense controller 940 may generate the logical signals described with reference to timing diagram 500 of FIG. 5.

In some embodiments, the sense controller 940 may compare a voltage of a first node of a sense amplifier with a voltage of a second node of a sense amplifier, where the voltages are based on (e.g., result from) accessing the memory cell with one or more access operations of a read operation. The sense controller 940 may determine a logic value associated with the memory cell based on comparing the resultant voltages. In some examples, the sense controller 940 may provide signals to another component to determine the logic value associated with the memory cell.

Figure 10:
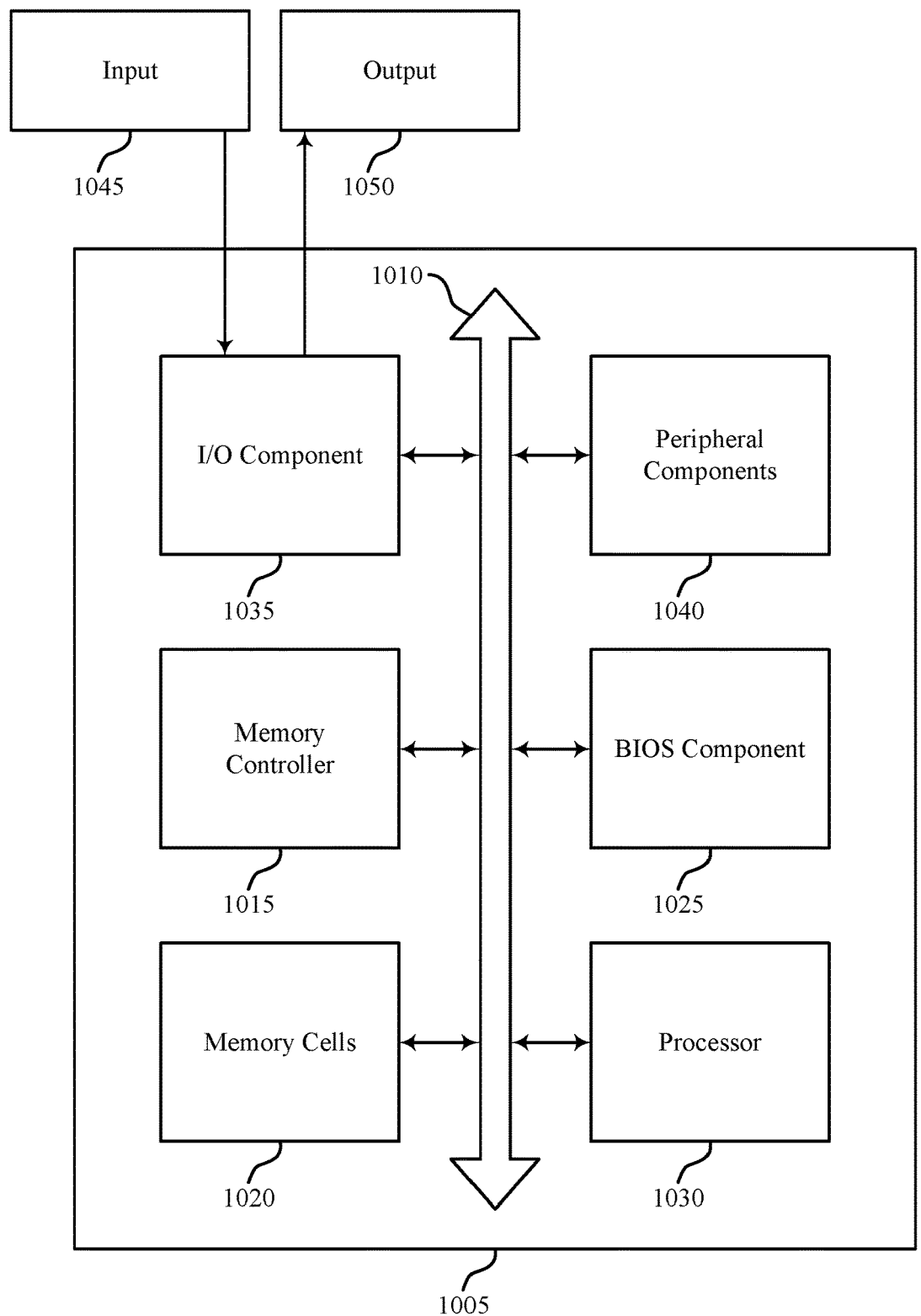
FIG. 10 shows a diagram of a system including a device that may support access schemes for section-based data protection in a memory device in accordance with various embodiments of the present disclosure.

FIG. 10 shows a diagram of a system 1000 including a device 1005 that may support access schemes for section-based data protection in a memory device in accordance with various embodiments of the present disclosure. The device 1005 may be an example of or include the components of memory device 100 as described above, for example, with reference to FIG. 1. The device 1005 may include components for bi-directional communications including components for transmitting and receiving communications, including a memory controller 1015, memory cells 1020, a basic input/output system (BIOS) component 1025, a processor 1030, an I/O component 1035, and peripheral components 1040. These components may be in electronic communication via one or more busses (e.g., bus 1010).

The memory controller 1015 may operate one or more memory cells as described herein. Specifically, the memory controller 1015 may be configured to support the described sensing schemes for accessing memory cells, or performing voltage adjustment operations. In some cases, the memory controller 1015 may include a row component, a column component, a plate component, or a combination thereof, as described with reference to FIGS. 1 through 5.

The memory cells 1020 may be an example of memory cells 105 or 810 described with reference to FIGS. 1 through 8, and may store information (e.g., in the form of a logic state) as described herein.

The BIOS component 1025 be a software component that includes BIOS operated as firmware, which may initialize and run various hardware components. The BIOS component 1025 may also manage data flow between a processor and various other components, such as peripheral components, I/O control components, and others. The BIOS component 1025 may include a program or software stored in read-only memory (ROM), flash memory, or any other non-volatile memory.

The processor 1030 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1030 may be configured to operate a memory array using a memory controller. In other cases, a memory controller may be integrated into the processor 1030. The processor 1030 may be configured to execute computer-readable instructions stored in a memory to perform various functions (e.g., functions or tasks supporting access schemes for section-based data protection in a memory device).

The I/O component 1035 may manage input and output signals for the device 1005. The I/O component 1035 may also manage peripherals not integrated into the device 05. In some cases, the I/O component 1035 may represent a physical connection or port to an external peripheral. In some cases, the I/O component 1035 may utilize an operating system such as iOS®, ANDROID®, MS-DOS®, MS-WINDOWS®, OS/2®, UNIX®, LINUX®, or another known operating system. In other cases, the I/O component 1035 may represent or interact with a modem, a keyboard, a mouse, a touchscreen, or a similar device. In some cases, the I/O component 1035 may be implemented as part of a processor. In some cases, a user may interact with the device 1005 via the I/O component 1035 or via hardware components controlled by the I/O component 1035. The I/O component 1035 may support accessing the memory cells 1020, including receiving information associated with the sensed logic state of one or more of the memory cells 1020, or providing information associated with writing a logic state of one or more of the memory cells 1020.

The peripheral components 1040 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1045 may represent a device or signal external to the device 1005 that provides input to the device 1005 or its components. This may include a user interface or an interface with or between other devices. In some cases, the input 1045 may be managed by the I/O component 1035, and may interact with the device 1005 via a peripheral component 1040.

The output 1050 may represent a device or signal external to the device 1005 configured to receive output from the device 1005 or any of its components. Examples of the output 1050 may include a display, audio speakers, a printing device, another processor or printed circuit board, or other devices. In some cases, the output 1050 may be a peripheral element that interfaces with the device 1005 via the peripheral component(s) 1040. In some cases, the output 1050 may be managed by the I/O component 1035.

The components of the device 1005 may include circuitry designed to carry out their functions. This may include various circuit elements, for example, conductive lines, transistors, capacitors, inductors, resistors, amplifiers, or other active or inactive elements, configured to carry out the functions described herein. The device 1005 may be a computer, a server, a laptop computer, a notebook computer, a tablet computer, a mobile phone, a wearable electronic device, a personal electronic device, or the like. Or the device 1005 may be a portion or element of such a device.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

As used herein, the term "terminal" need not suggest a physical boundary or connection point of a circuit element. Rather, "terminal" may refer to a reference point of a circuit relevant to the circuit element, which may also be referred to as a "node" or "reference point."

As used herein, the term "layer" may refer to a stratum or sheet of a geometrical structure. each layer may have three dimensions (e.g., height, width, and depth) and may cover some or all of a surface. For example, a layer may be a three-dimensional structure where two dimensions are greater than a third, such as a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, such as, transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory device 100, circuit 200, and circuit 400, described with reference to FIGS. 1, 2, and 4, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    performing an access operation on a target memory cell of a section of a memory device, wherein performing the access operation comprises activating a first word line from a plurality of word lines of the section to selectively couple the target memory cell with one of a plurality of digit lines of the section; and
    performing an equalization operation on a second memory cell of the section based at least in part on performing the access operation, wherein performing the equalization operation comprises activating a second word line from the plurality of word lines of the section.

2. The method of claim 1, wherein performing the equalization operation comprises:
    equalizing a bias across the second memory cell concurrently with the second word line being activated.

3. The method of claim 1, wherein performing the equalization operation comprises:
    equalizing a bias across a ferroelectric capacitor of the second memory cell.

4. The method of claim 1, wherein performing the equalization operation comprises:
    activating the second word line to selectively couple the second memory cell with the one of the plurality of digit lines.

5. The method of claim 1, further comprising:
    selecting the target memory cell for the access operation; and
    performing the access operation and performing the equalization operation in response to the selecting.

6. The method of claim 1, wherein:
    activating the first word line comprises biasing the first word line with a first voltage; and
    activating the second word line comprises biasing the second word line with a second voltage having a lower magnitude than the first voltage.

7. An apparatus comprising:
    a section of a memory device comprising:
        a plurality of memory cells;
        a plurality of word lines coupled with the plurality of memory cells; and
        a plurality of digit lines coupled with the plurality of memory cells; and
    a controller coupled with the section of the memory device and operable to:
        perform an access operation on a target memory cell of the plurality of memory cells, wherein performing the access operation comprises activating a first word line from the plurality of word lines to selectively couple the target memory cell with one of the plurality of digit lines; and
        perform an equalization operation on a second memory cell of the plurality of memory cells based at least in part on performing the access operation, wherein performing the equalization operation comprises activating a second word line from the plurality of word lines.

8. The apparatus of claim 7, wherein, to perform the equalization operation, the controller is operable to:
    equalize a bias across the second memory cell concurrently with the second word line being activated.

9. The apparatus of claim 7, wherein, to perform the equalization operation, the controller is operable to:
    equalize a bias across a ferroelectric capacitor of the second memory cell.

10. The apparatus of claim 7, wherein, to perform the equalization operation, the controller is operable to:
    activate the second word line to selectively couple the second memory cell with the one of the plurality of digit lines.

11. The apparatus of claim 7, wherein the controller is further operable to:
    select the target memory cell for the access operation; and
    perform the access operation and perform the equalization operation in response to the selecting.

12. The apparatus of claim 7, wherein:
to activate the first word line, the controller is operable to bias the first word line with a first voltage; and
to activate the second word line, the controller is operable to bias the second word line with a second voltage having a lower magnitude than the first voltage.

13. The apparatus of claim 7, wherein, to perform the equalization operation, the controller is operable to:
activate each of the plurality of word lines simultaneously.

14. The apparatus of claim 13, wherein, to perform the equalization operation, the controller is operable to:
activate each of the plurality of word lines according to a sequential word line order.

15. The apparatus of claim 14, wherein, to perform the equalization operation, the controller is operable to:
bias each of the plurality of digit lines according to a sequential digit line order, wherein the biasing according to the sequential digit line order occurs at a different rate than the activating according to the sequential word line order.

16. An apparatus comprising:
a section of a memory device comprising:
a plurality of memory cells;
a plurality of word lines coupled with the plurality of memory cells; and
a plurality of digit lines coupled with the plurality of memory cells; and
a controller coupled with the section of the memory device and operable to:
select a target memory cell from the plurality of memory cells for an access operation;
perform the access operation on the target memory cell, wherein the access operation comprises selectively coupling the target memory cell with one of the plurality of digit lines; and
perform an equalization operation on a second memory cell of the plurality of memory cells based at least in part on performing the access operation, wherein the equalization operation comprises selectively coupling the second memory cell with the one of the plurality of digit lines.

17. The apparatus of claim 16, wherein, to perform the equalization operation, the controller is operable to:
equalize a bias across a ferroelectric capacitor of the second memory cell.

18. The apparatus of claim 17, wherein, to perform the equalization operation, the controller is operable to:
activate one of the plurality of word lines to selectively couple the second memory cell with the one of the plurality of digit lines.

19. The apparatus of claim 16, wherein, to perform the equalization operation, the controller is operable to:
activate each of the plurality of word lines simultaneously.

20. The apparatus of claim 16, wherein, to perform the equalization operation, the controller is operable to:
equalize a bias across a ferroelectric capacitor of the second memory cell.

* * * * *